US009685965B2

(12) United States Patent
Hashimoto

(10) Patent No.: US 9,685,965 B2
(45) Date of Patent: Jun. 20, 2017

(54) ELECTRONIC CIRCUIT FOR CONTROLLING AN OSCILLATOR, AND RELATED METHOD

(71) Applicant: FUJITSU LIMITED, Kawasaki-shi, Kanagawa (JP)

(72) Inventor: Tetsutaro Hashimoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/155,471

(22) Filed: May 16, 2016

(65) Prior Publication Data

US 2016/0380641 A1  Dec. 29, 2016

(30) Foreign Application Priority Data

Jun. 29, 2015 (JP) ................................. 2015-129838
Dec. 24, 2015 (JP) ................................. 2015-252354

(51) Int. Cl.
| H03L 7/085 | (2006.01) |
| H03L 7/18 | (2006.01) |
| H03L 7/099 | (2006.01) |
| H03L 7/093 | (2006.01) |
| H03L 7/091 | (2006.01) |
| H03K 5/06 | (2006.01) |
| H03L 7/095 | (2006.01) |

(52) U.S. Cl.
CPC ............... *H03L 7/18* (2013.01); *H03K 5/06* (2013.01); *H03L 7/091* (2013.01); *H03L 7/093* (2013.01); *H03L 7/095* (2013.01); *H03L 7/0991* (2013.01)

(58) Field of Classification Search
CPC . H03L 5/00; H03L 7/091; H03L 7/093; H03L 7/0991; H03L 7/18; G05B 13/024; H03K 5/06

USPC .... 331/182, 185, 175, 183, 16, 1 A; 327/39, 327/47; 700/28
See application file for complete search history.

(56) References Cited

U.S. PATENT DOCUMENTS 7,148,757 B2 * 12/2006 Chiu ......................... H03L 7/18
327/156

FOREIGN PATENT DOCUMENTS

| JP | 11-288325 | 10/1999 |
| JP | 2002-202829 | 7/2002 |
| JP | 2008-98322 | 4/2008 |

OTHER PUBLICATIONS

Espacenet Bibliographic data, Publication No. 2008-98322, published Apr. 24, 2008.

(Continued)

*Primary Examiner* — Arnold Kinkead
(74) *Attorney, Agent, or Firm* — Staas & Halsey LLP

(57) ABSTRACT

An electronic circuit is described including an oscillator generating an oscillating signal having a cycle responsive to an input signal, a voltage detector producing a detection signal responsive to a power supply voltage, a frequency divider generating a frequency-divided signal obtained by dividing a frequency of the oscillating signal by a frequency-division ratio responsive to the detection signal, and an adder obtaining a sum of a first signal and a second signal and to supply a signal responsive to the sum to the oscillator as the input signal. The first signal is responsive to a difference in phase between the frequency-divided signal and a reference signal, and the second signal is responsive to the detection signal. A related method is also described.

12 Claims, 18 Drawing Sheets

(56) References Cited

OTHER PUBLICATIONS

Espacenet Bibliographic data, Publication No. 11-288325, published Oct. 19, 1999.
Espacenet Bibliographic data, Publication No. 2002-202829, published Jul. 19, 2002.
Jiao, D. et al., "Design, Modeling, and Test of a Programmable Adaptive Phase-Shifting PLL for Enhancing Clock Data Compensation", *IEEE Journal of Solid-state Circuits*, vol. 47, No. 10, Oct. 2012, pp. 2505-2516.
Floyd, M.S. et al., "Runtime power reduction capability of the IBM POWER7+ chip", *IBM J. Res. & Dev*, vol. 57, No. 6, Paper 2, Nov./Dec. 2013, pp. 2:1-2:17.

* cited by examiner

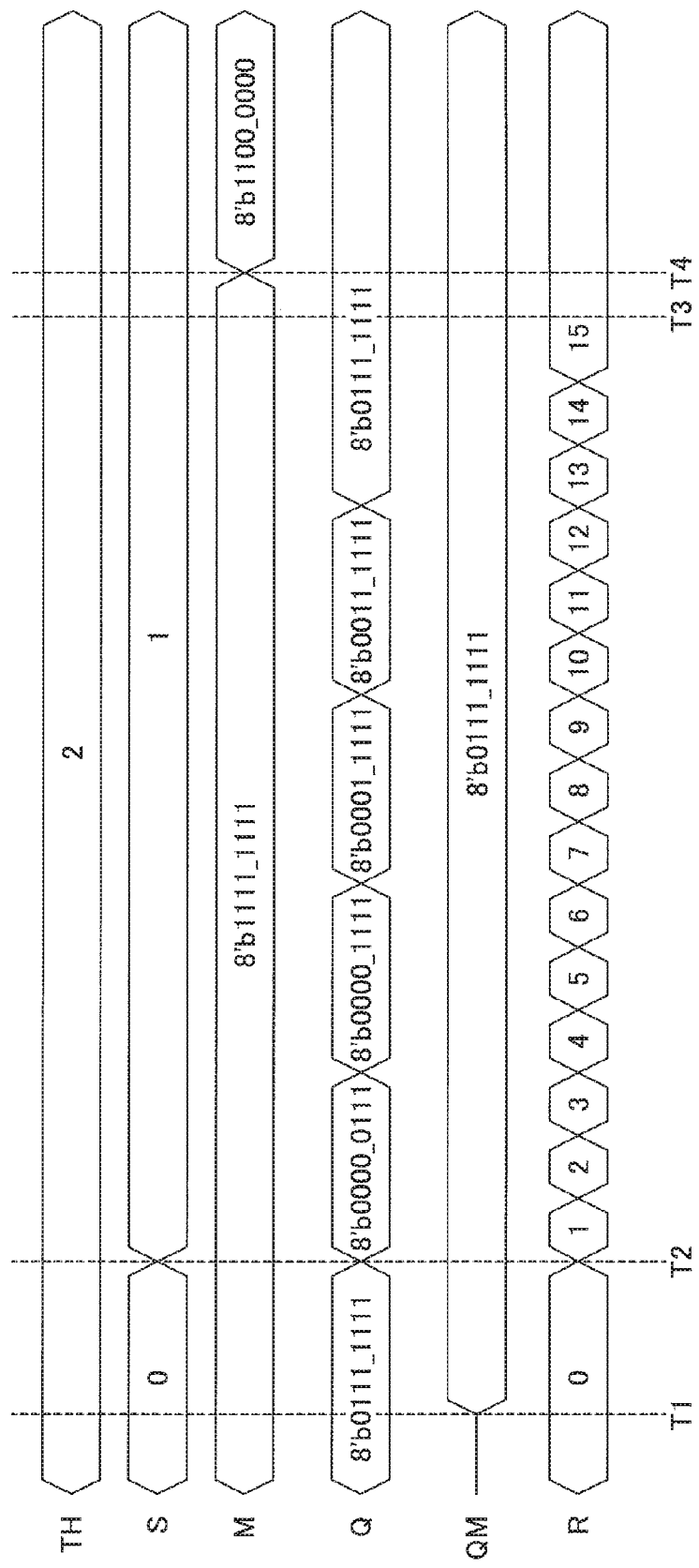

ELECTRONIC CIRCUIT FOR CONTROLLING AN OSCILLATOR, AND RELATED METHOD

CROSS-REFERENCE TO RELATED APPLICATIONS

The present application is based upon and claims the benefit of priority from the prior Japanese Patent Applications No. 2015-129838 filed on Jun. 29, 2015 and No. 2015-252354 filed on Dec. 24, 2015, with the Japanese Patent Office, the entire contents of which are incorporated herein by reference.

FIELD

The disclosures herein relate to an electronic circuit and a method of controlling an oscillator.

BACKGROUND

LSI (Large Scale Integration) digital circuits operate in synchronization with clock signals. In the case of large circuit scale, consumption of a significant amount of electric current occurs at a clock transition, thereby generating power supply noise in the power supply voltage, which is known as an IR drop. Such an IR drop causes the power supply voltage to exhibit a voltage change having a frequency range that is determined by the impedances of a power supply line and a stabilizing capacitor. This change generally has a frequency range of approximately 50 MHz to 150 MHz.

A drop in the power supply voltage causes a deterioration in the transition speed of a signal propagating through a signal line in the LSI circuit, which may cause a failure in data transfer in a critical path or the like that has only a small timing margin for signal propagation. In order to avoid such timing error, an LSI such as a processor may adaptively control the operating frequency in response to a voltage drop. To be more specific, the voltage is measured, and an increase in the delay in the data path caused by the voltage drop is estimated, followed by increasing the clock cycle such as to cancel the increase in the delay.

As is generally known, the frequency-division ratio of a PLL (phase-locked loop) circuit may be changed in order to change a clock cycle. This method measures an effect of a voltage drop on the timing, and changes the frequency-division ratio of the PLL circuit based on the measurements to lower the oscillating frequency of the PLL circuit, thereby achieving adaptive frequency control.

This adaptive frequency control involves changing the oscillating frequency by use of the control system of the PLL circuit, so that it takes a long time to set the oscillating frequency of the PLL circuit to a desired frequency after the change in the frequency-division ratio. For example, a time length equivalent to more than 200 cycles of a reference clock may be needed. Such control is still able to make a change in the clock frequency that properly follows a voltage drop when the voltage drop is a slow change (e.g., a change of several tens of kilo hertz in terms of frequency).

An IR drop that occurs in response to an increase in a processor's utilization rate, for example, is a fast change having a frequency range of approximately 50 MHz to 150 MHz as was previously described. Accordingly, the adaptive frequency control that changes the frequency-division ratio of a PLL circuit is unable to make a clock frequency change that follows a voltage drop, thereby failing to avoid timing error.

[Patent Document 1] Japanese Laid-open Patent Publication No. H11-288325
[Patent Document 2] Japanese Laid-open Patent Publication No. 2002-202829
[Non-Patent Document 1] Dong Jiao, Bongjin Kim, and Chris H. Kim, "Design, Modeling, and Test of a Programmable Adaptive Phase-Shifting PLL for Enhancing Clock Data Compensation," The Journal of Solid-state Circuits, VOL. 47, NO. 10, October 2012, pp 2505-2012
[Non-Patent Document 2] M. S. Floyd, et al., "Runtime power reduction capability of the IBM POWER7+ chip," IBM J. RES. & DEV. VOL. 57, NO. 6, PAPER 2, November/December 2013, pp 2:1-2:17

SUMMARY

According to an aspect of the embodiment, an electronic circuit includes an oscillator configured to generate an oscillating signal having a cycle responsive to an input signal, a voltage detector configured to produce a detection signal responsive to a power supply voltage, a frequency divider configured to generate a frequency-divided signal obtained by dividing a frequency of the oscillating signal by a frequency-division ratio responsive to the detection signal, and an adder configured to obtain a sum of a first signal and a second signal and to supply a signal responsive to the sum to the oscillator as the input signal, the first signal being responsive to a difference in phase between the frequency-divided signal and a reference signal, and the second signal being responsive to the detection signal.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 21 is a timing chart illustrating an example of the setting operation performed by the control circuit.

DESCRIPTION OF EMBODIMENTS

In the following, embodiments of the invention will be described with reference to the accompanying drawings.

Figure 1:
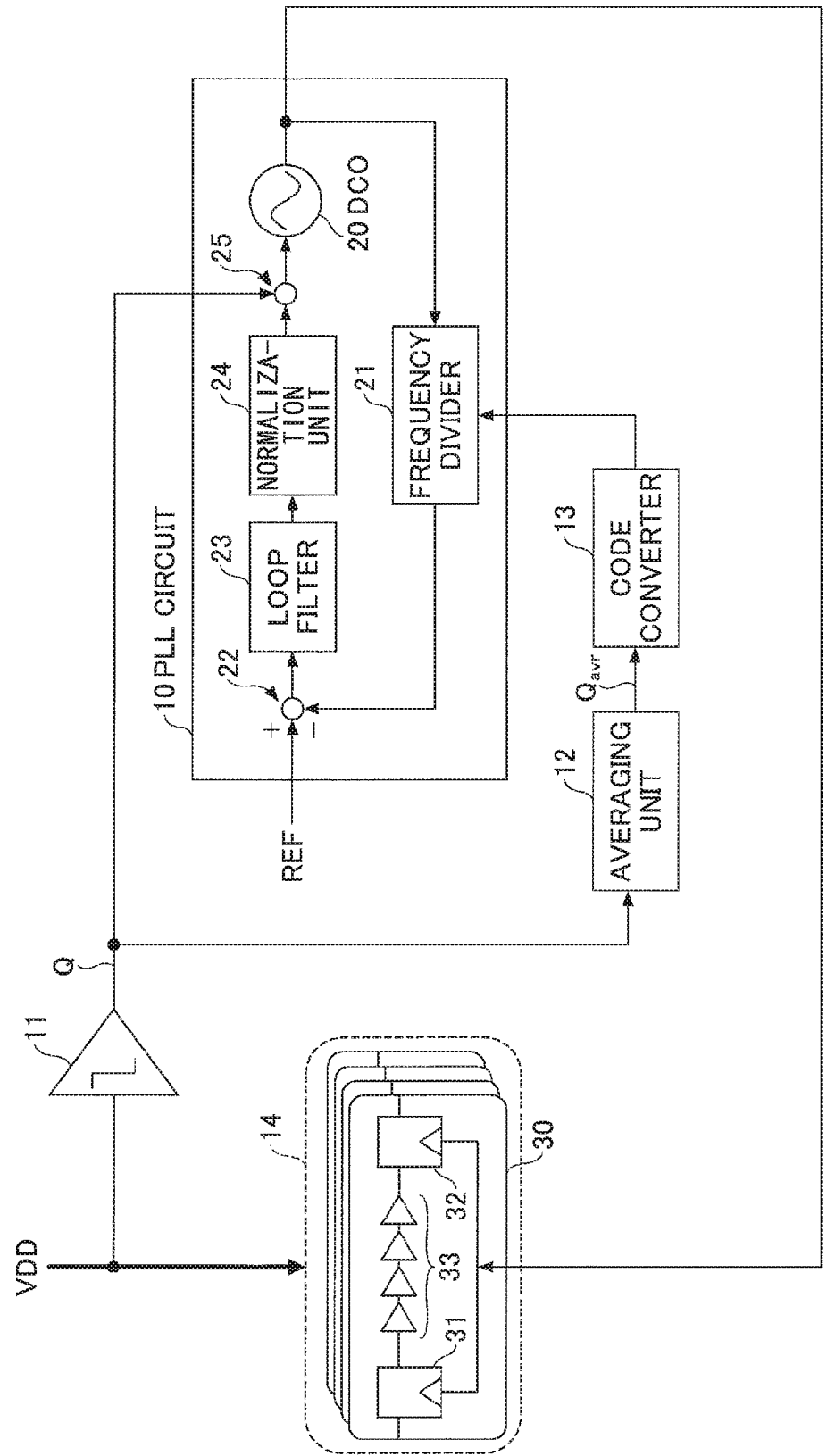
FIG. 1 is a drawing illustrating an example of an embodiment of an electronic circuit configured to change oscillating frequency in such a manner as to follow voltage noise.

FIG. 1 is a drawing illustrating an example of an embodiment of an electronic circuit configured to change oscillating frequency in such a manner as to follow voltage noise. An electronic circuit illustrated in FIG. 1 includes a PLL circuit 10, an AD converter 11, an averaging unit 12, a code converter 13, and a logic circuit 14. The PLL circuit 10 includes a digitally controlled oscillator (DCO) 20, a frequency divider 21, a phase comparator 22, a loop filter 23, a normalization unit 24, and an adder 25. The logic circuit 14 includes a data path 30. The data path 30 includes a flip-flop 31, a flip-flop 32, and circuit elements 33. The clock input terminals of the flip-flops 31 and 32 receive an oscillating signal (i.e., clock signal) generated by the PLL circuit 10.

In FIG. 1, boundaries between functional or circuit blocks illustrated as boxes basically indicate functional boundaries, and may not correspond to separation in terms of physical positions, separation in terms of electrical signals, separation in terms of control logic, etc. Each functional or circuit block may be a hardware module that is physically separated from other blocks to some extent, or may indicate a function in a hardware module in which this and other blocks are physically combined together.

A power supply voltage VDD is applied to the logic circuit 14. Each circuit element of the logic circuit 14 operates with the power supply voltage VDD serving as an operating power. The power supply voltage VDD is also applied to the AD converter 11. The AD converter 11 functions as a potential detector to produce a detection signal Q responsive to the applied power supply voltage. The detection signal Q may be a digital code represented in a plurality of bits each of which assumes a value of "0" or "1". The detection signal Q produced by the AD converter 11 is supplied to the averaging unit 12 and also supplied to the adder 25 of the PLL circuit 10.

The averaging unit 12 takes a time average of the detection signal Q to produce a averaged value signal $Q_{avr}$. In the case of the detection signal Q being digital code, the averaged value signal $Q_{avr}$ may be produced by obtaining a sum of the values of the detection signal Q over two or more clock cycles that is a predetermined number of clock cycles and by dividing the sum by such a predetermined number. The averaged value signal $Q_{avr}$ produced by the averaging unit 12 is supplied to the code converter 13.

The code converter 13 generates a frequency-division-ratio setting code responsive to the averaged value signal $Q_{avr}$. The frequency-division-ratio setting code generated by the code converter 13 is supplied to the frequency divider 21 of the PLL circuit 10 as a control signal for setting the frequency-division ratio.

The digitally controlled oscillator 20 of the PLL circuit 10 generates an oscillating signal having a frequency responsive to the signal input into the digitally controlled oscillator 20. The oscillating signal generated by the digitally controlled oscillator 20 is supplied to the frequency divider 21. The frequency divider 21 divides the frequency of the oscillating signal by the frequency-division ratio responsive to the frequency-division-ratio setting code (i.e., the frequency-division ratio responsive to the detection signal Q) to produce a frequency-divided signal.

The phase comparator 22 produces a phase detection signal responsive to a phase difference between the frequency-divided signal produced by the frequency divider 21 and a reference signal REF. The phase detection signal assumes a negative value (or a value smaller than a predetermined reference value), for example, in the case of the phase of the frequency-divided signal being later than the phase of the reference signal REF, and assumes a positive value (or a value larger than the predetermined reference value), for example, in the case of the phase of the frequency-divided signal being earlier than the phase of the reference signal REF. The phase detection signal may have a value thereof (or a difference from the predetermined reference value) that is responsive to the phase difference between the phase of the frequency-divided signal and the phase of the reference signal REF. The phase detection signal may be a digital code represented in a plurality of bits each of which assumes a value of "0" or "1".

The loop filter 23 may be a low-pass filter that allows lower frequency components of the phase detection signal produced by the phase comparator 22 to pass therethrough, while blocking or suppressing higher frequency components thereof. The loop filter 23 may be implemented by use of a digital filter. The loop filter 23 performs a low-pass filtering process with respect to the phase detection signal to generate phase-difference information indicative of a trend of phase differences over a relatively long time period without being affected by small temporary fluctuations. The phase-difference information may be a digital code represented in a plurality of bits each of which assumes a value of "0" or "1".

The normalization unit 24 multiplies the supplied phase-difference information by a predetermined factor to produce a phase-difference code having a proper value as a signal input into the digitally controlled oscillator 20. For the digitally controlled oscillator 20, a change in the oscillating frequency that is brought about by a 1-bit change of the LSB (least significant bit) of the input signal varies depending on the oscillating frequency. The normalization unit 24 multiplies the phase-difference information by the factor that cancels a difference in the sensitivity of the digitally controlled oscillator 20 that varies from oscillating frequency to oscillating frequency, thereby eliminating the frequency-dependent component in the sensitivity of the digitally controlled oscillator 20. There may be no need to provide the normalization unit 24 when the frequency-dependent component in the sensitivity of the digitally controlled oscillator 20 can be ignored. The phase-difference code generated by the normalization unit 24 is supplied to the adder 25. The phase-difference code may be a digital code represented in a plurality of bits each of which assumes a value of "0" or "1".

The adder 25 obtains the sum of the phase-difference code responsive to the phase difference between the frequency-divided signal and the reference signal REF and the signal responsive to the detection signal Q supplied from the AD converter 11. The adder 25 supplies a signal responsive to the obtained sum to the digitally controlled oscillator 20 as an input signal thereinto. The signal added to the phase-difference code by the adder 25 may be the detection signal Q itself that is supplied from the AD converter 11, or may be a normalized signal obtained by multiplying the detection signal Q by a constant factor such that the size of the normalized signal is suitable as an input into the digitally controlled oscillator 20.

Alternatively, the detection signal Q smaller than a predetermined value may be ignored when the value of the detection signal Q is configured to increase in response to a drop in the power supply voltage VDD, for example, such that the signal added to the phase-difference code is equal to the detection signal Q for the detection signal Q greater than the predetermined value, and has the minimum value thereof that is equal to the predetermined value. The use of such an adjusted signal enables the realization of control operation by which the frequency adjustment operation by the PLL circuit 10 is not performed in the case of the power supply voltage VDD being greater than a predetermined level. Namely, frequency adjustment is performed with respect to a drop of the power supply voltage VDD below the predetermined level, but is not performed with respect to a rise of the power supply voltage VDD above the predetermined level.

In the example illustrated in FIG. 1, the signal added by the adder 25 to the phase-difference code supplied from the normalization unit 24 is the detection signal Q itself that is produced by the AD converter 11. It may be noted, however, that a minimum limit value may be set for the output of the AD converter 11, for example, thereby making provision such that frequency adjustment is performed with respect to a drop of the power supply voltage VDD below a predetermined level, but is not performed with respect to a rise of the power supply voltage VDD above the predetermined level.

The signal input into the digitally controlled oscillator 20 may be a digital code represented in a plurality of bits each of which assumes a value of "0" or "1". The digitally controlled oscillator 20 may be an LC oscillator, for example. Variable capacitance elements such as varactors may be connected together in parallel to constitute a parallel capacitance. The control terminals of these variable capacitance elements may receive respective bits of the input signal. Setting the individual bits of the input signal to either "0" or "1" serves to control the size of the parallel capacitance, thereby causing the digitally controlled oscillator 20 to oscillate with the cycle (or frequency) responsive to the controlled parallel capacitance.

The oscillating signal generated by the digitally controlled oscillator 20 of the PLL circuit 10 is supplied to the logic circuit 14 as a clock signal. As was previously described, the logic circuit 14 operates with the power supply voltage VDD. The clock terminals of the flip-flops in the logic circuit 14 receive the clock signal.

In the electronic circuit illustrated in FIG. 1, an increase in the value of the signal input into the digitally controlled oscillator 20 may cause the cycle of the oscillating signal of the digitally controlled oscillator 20 to increase in length. Conversely, a decrease in the value of the signal input into the digitally controlled oscillator 20 may cause the cycle of the oscillating signal of the digitally controlled oscillator 20 to decrease in length. In such a case, provision may be made such that a drop in the power supply voltage VDD causes the value of the detection signal Q produced by the AD converter 11 to increase. Alternatively, the relationship between a change in the value of the signal input into the digitally controlled oscillator 20 and a change in the length of the cycle of the oscillating signal generated by the digitally controlled oscillator 20 may be reversed from the relationship described above. In such a case, provision may be made such that the value of the detection signal Q produced by the AD converter 11 decreases in response to a drop in the power supply voltage VDD.

As the detection signal Q having increased in response to a drop in the power supply voltage VDD stays in the increased state for a prolonged period of time, the averaged value signal $Q_{avr}$ produced by the averaging unit 12 also increases. In response to an increase in the averaged value signal $Q_{avr}$, the code converter 13 changes the frequency-division-ratio setting code such as to decrease the frequency-division ratio. As a result, the oscillating frequency of the PLL circuit 10 is lowered, resulting in an increase in the length of the cycle of the oscillating signal. In this manner, with the detection signal Q being in a dropped state as evaluated based on a long-term average, the averaged value signal $Q_{avr}$ generated by the averaging unit 12 increases, thereby elongating the cycle of the clock signal generated by the PLL circuit 10.

In the logic circuit 14 which operates with the power supply voltage VDD, a drop in the power supply voltage VDD serves to lower the driving power that creates a transition in the output signal of each circuit element. This serves to lower the speed of signals propagating between the circuit elements and thus lowers the speed of signals propagating between flip-flops. In the logic circuit 14 illustrated in FIG. 1, for example, the data path 30 may be the critical path having the smallest timing margin among a plurality of data paths existing in the logic circuit 14. In the data path 30, data output from the flip-flop 31 propagates through the circuit elements 33 to be stored in the flip-flop 32. Storing of data by the flip-flop 32 is performed in synchronization with the clock signal (i.e., oscillating signal) generated by the PLL circuit 10. An increase in the time length required for the signal to propagate between the flip-flops 31 and 32 in the data path 30 as a result of a drop in the power supply voltage VDD may cause the storing of data in the flip-flop 32 to fail on the receiving side.

As was previously described, the frequency-division ratio is set to a smaller value when the power supply voltage VDD is in the dropped state as evaluated based on a long-term average, which results in an elongation of the cycle of the clock signal generated by the PLL circuit 10. This arrangement serves to prevent a failure of data transfer in data paths such as the data path 30 existing in the logic circuit 14.

As the logic circuit 14 operates in synchronization with the clock signal of the PLL circuit 10, electric current is consumed at the clock transitions, which may create an IR drop in the power supply voltage VDD. An IR drop is not prominent during the routine operations of the logic circuit 14. In the case of the logic circuit 14 being a processor, however, an IR drop occurring when the processor changes its operation mode, for example, has a significant magnitude that cannot be ignored. In such a case, a sudden change in the power supply voltage VDD has a frequency range of approximately 50 MHz to 150 MHz as was previously described.

With such a sudden change in the power supply voltage VDD, a change in the frequency-division ratio of the frequency divider 21 made by the code converter 13 as described above is not sufficient for the purpose of changing, at proper speed, the cycle of the clock signal CLK generated by the digitally controlled oscillator 20. It may be noted that a transitory change in the power supply voltage VDD is ignored due to the averaging function of the averaging unit 12. Even if the averaging unit 12 is not provided, a change in the frequency-division ratio of the frequency divider 21 made in response to a transitory change in the power supply voltage VDD does not cause the cycle of the clock signal to change at sufficient speed. This is because, with the use of the control system of the PLL circuit to change the oscillating frequency, it takes a long time for the oscillating frequency of the PLL circuit to reach a desired value upon a change of the frequency-division ratio.

In the electronic circuit illustrated in FIG. 1, the detection signal Q that is output from the AD converter 11 is added by the adder 25 to the signal input into the digitally controlled oscillator 20. This arrangement allows the oscillating frequency of the PLL circuit 10 to change the instant a sudden change occurs in the power supply voltage VDD. In the PLL circuit 10, a digital code corresponding to the detection signal Q is added to the digital code input into the digitally controlled oscillator 20, so that an increase in the detection signal Q in response to a drop in the power supply voltage VDD serves to increase the value of the input into the digitally controlled oscillator 20. The digitally controlled oscillator 20 is configured to oscillate at an oscillating cycle responsive to the input value, such that an increase in the input value serves to elongate the length of the oscillating cycle. Such control of the oscillating cycle performed by directly adjusting the input into the digitally controlled oscillator 20 allows the oscillating cycle to change immediately at high speed in response to a change in the power supply voltage VDD. Namely, this arrangement enables the realization of a change in the oscillating cycle that follows a change in the power supply voltage VDD.

Figure 2:
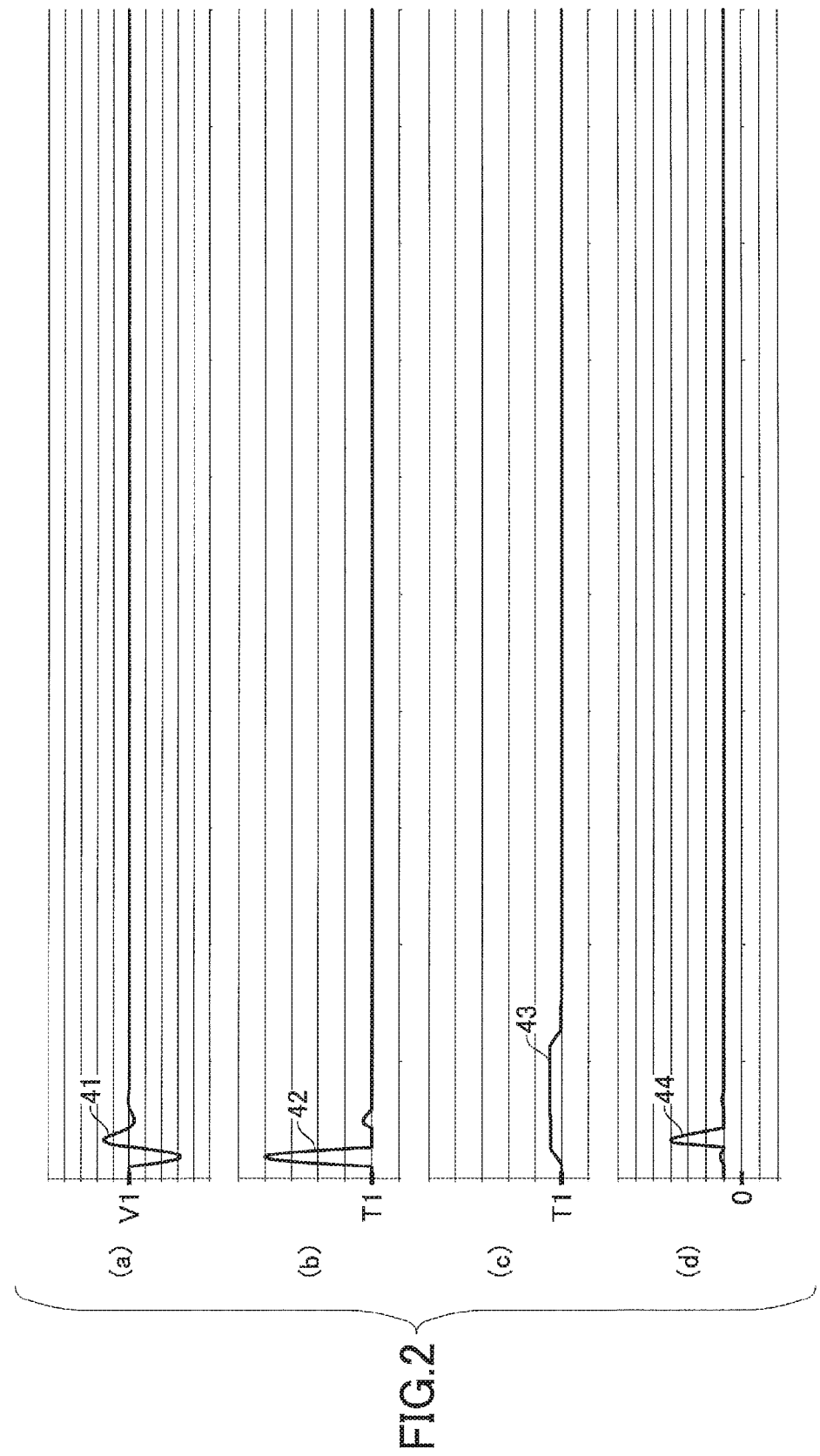
FIG. 2 is a drawing illustrating an example of the operation performed by a PLL circuit illustrated in FIG. 1 in response to a sudden change in a power supply voltage VDD.

FIG. 2 is a drawing illustrating an example of the operation performed by the PLL circuit illustrated in FIG. 1 in response to a sudden change in the power supply voltage VDD. In FIG. 2, the letter designation (a) identifies the voltage value of the power supply voltage VDD. The letter designation (b) identifies the oscillating cycle of the PLL circuit 10. The letter designation (c) identifies an average value of the oscillating cycle of the PLL circuit 10. The letter designation (d) identifies a timing margin in the data path 30 that is the critical path of the logic circuit 14. The horizontal axis of each waveform diagram represents time. A predetermined voltage level of the power supply voltage VDD that is applied to the electronic circuit illustrated in FIG. 1 is denoted as V1. A predetermined oscillating cycle of the PLL circuit 10 corresponding to the power supply voltage V1 is denoted as T1.

As illustrated in FIG. 2-(a), a change identified as a waveform 41 occurs in the power supply voltage VDD due to an IR drop or the like. This voltage change is a high-speed change having a frequency range of approximately 50 MHz to 150 MHz. The power supply voltage VDD drops below the predetermined voltage V1 due to the IR drop, and, then, the voltage returns to the original level in response to the supply of electric current from the stabilizing capacitance and through the power supply line, followed by a voltage overshoot caused by the supply of electric current for restoration. As a result, the power supply voltage VDD temporarily becomes higher than the predetermined voltage V1.

The digital code input into the digitally controlled oscillator 20 increases in response to the voltage drop shown as the waveform 41, so that the oscillating cycle of the digitally controlled oscillator 20 changes as shown by a waveform 42 in FIG. 2-(b). An average value of the oscillating cycle reflecting the averaging function or integrating function of the loop filter 23 in the control loop (i.e., phase synchronization loop) of the PLL changes as shown by a waveform 43 in FIG. 2-(c).

A change in the timing margin of the data path 30 attributable to a change in the power supply voltage VDD has a waveform similar to the waveform 41 illustrated in FIG. 2-(a) which indicates the change of the power supply voltage VDD. Further, a change in the timing margin of the data path 30 attributable to an adjustment in the clock cycle has a waveform similar to the waveform 42 illustrated in FIG. 2-(b) which indicates the change of the clock cycle. Accordingly, the timing margin obtained by canceling the effect of the change of the power supply voltage VDD with the effect of the adjustment of the clock cycle is equal to a sum obtained by adding the waveform 41 of FIG. 2-(a) and the waveform 42 of FIG. 2-(b) together after some size adjustment, and may have a waveform such as a waveform 44 illustrated in FIG. 2-(d). As shown by the waveform 44 in FIG. 2-(d), the timing margin is kept above the level at which the timing margin is zero, i.e., is kept in the state in which a positive timing margin is provided. The logic circuit 14 can thus operate properly without timing error.

Figure 3:
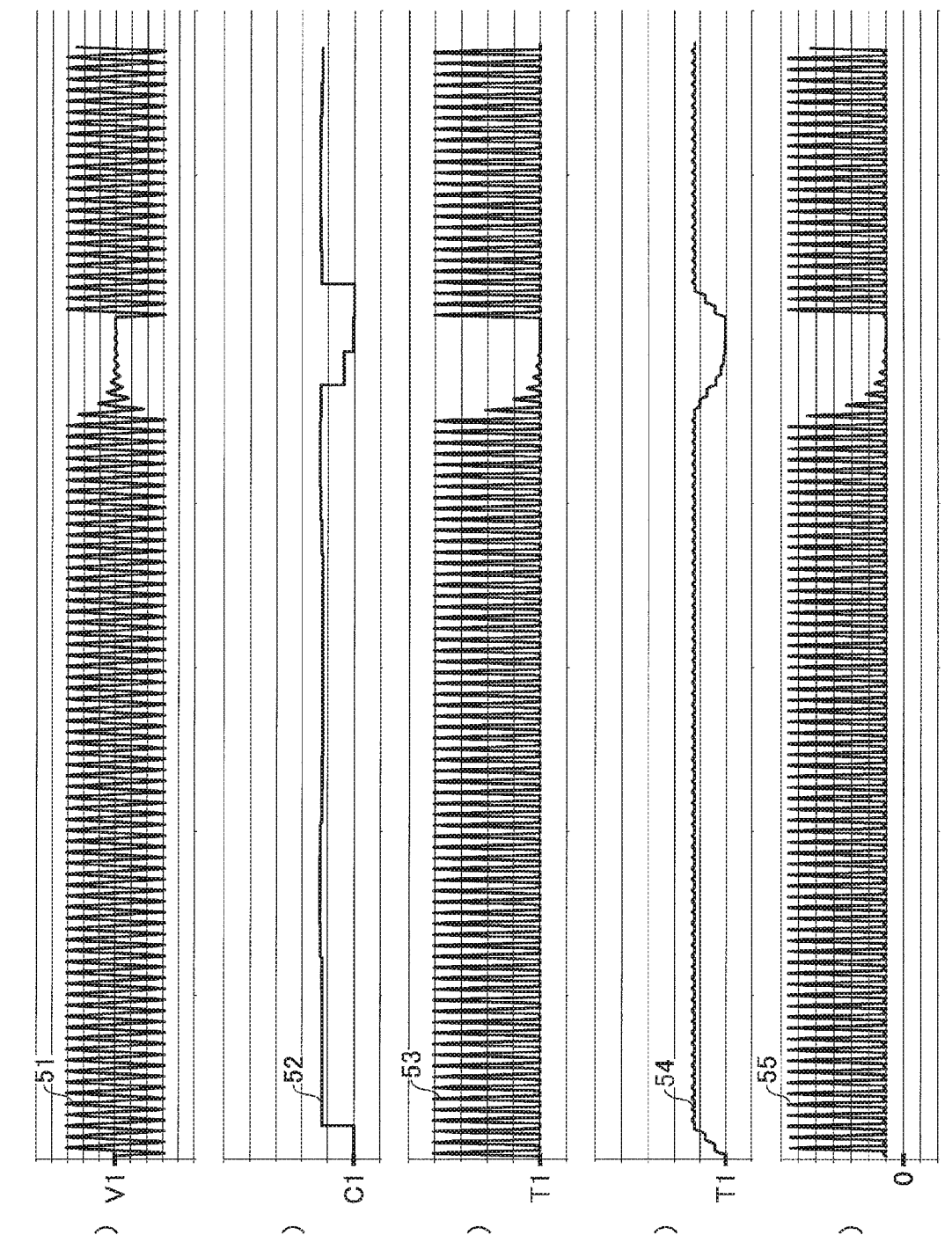
FIG. 3 is a drawing illustrating an example of the operation performed by the PLL circuit illustrated in FIG. 1 in response to continuing changes in the power supply voltage VDD.

FIG. 3 is a drawing illustrating an example of the operation performed by the PLL circuit illustrated in FIG. 1 in response to continuing changes in the power supply voltage VDD. In FIG. 3, the letter designation (a) identifies the voltage value of the power supply voltage VDD. The letter designation (b) identifies the oscillating cycle that is a goal to be achieved by the control loop of the PLL, and that is equal to the oscillating cycle corresponding to the frequency-division ratio that is set to the frequency divider 21. The letter designation (c) identifies the oscillating cycle of the PLL circuit 10. The letter designation (d) identifies an average value of the oscillating cycle of the PLL circuit 10. The letter designation (e) identifies a timing margin in the data path 30 that is the critical path of the logic circuit 14. The horizontal axis of each waveform diagram represents time. A predetermined voltage level of the power supply voltage VDD that is applied to the electronic circuit illustrated in FIG. 1 is denoted as V1. A target oscillating cycle of the PLL circuit 10 corresponding to the power supply voltage V1 is denoted as C1. A predetermined oscillating cycle of the PLL circuit 10 corresponding to the power supply voltage V1 is denoted as T1.

In the example illustrated in FIG. 3-(a), IR drops cause periodic changes to occur in the power supply voltage VDD as shown by a waveform 51. This voltage change is a high-speed change having a frequency range of approximately 50 MHz to 150 MHz. The operating mode of an LSI such as a processor may make a transition from the standby mode to the operating mode in a cyclic manner. Such cyclic transitions may create changes in the power supply voltage VDD as illustrated in FIG. 3-(a). The waveform 51 illustrated in FIG. 3-(a) has the upper-side waveforms above the predetermined voltage V1 and the lower-side waveforms below the predetermined voltage V1 that are substantially the same in amplitude. In reality, however, the fact that the waveform 51 is created by drops in the power supply voltage VDD resulting from IR drops and rises in the power supply voltage VDD resulting from overshooting makes the amplitude of the upper-side waveforms above the voltage V1 smaller than the amplitude of the lower-side waveforms below the voltage V1.

The waveform 51 of the power supply voltage VDD illustrated in FIG. 3-(a) causes the average of the power supply voltage VDD to be continuously below the predetermined voltage V1. Because of this, the target oscillating cycle of the PLL control loop, i.e., the oscillating cycle corresponding to the frequency-division ratio set to the frequency divider 21, is elongated. Namely, the target oscillating cycle of the PLL control loop increases as shown by the waveform 52 in FIG. 3-(b).

In response to the voltage drops as shown by the waveform 51 of FIG. 3-(a), the digital code input into the digitally controlled oscillator 20 increases, thereby causing the oscillating cycle of the digitally controlled oscillator 20 to be changed as shown by a waveform 53 in FIG. 3-(c). Moreover, an average value of the oscillating cycle reflecting the averaging function or integrating function of the loop filter 23 in the control loop (i.e., phase synchronization loop) of the PLL changes as shown by a waveform 54 in FIG. 3-(d).

The timing margin obtained by canceling the effect of the change of the power supply voltage VDD with the effect of the adjustment of the clock cycle is equal to a sum obtained by adding the waveform 51 of FIG. 3-(a) and the waveform 53 of FIG. 3-(c) together after some size adjustment, and may have a waveform such as a waveform 55 illustrated in FIG. 3-(e). As shown by the waveform 55 in FIG. 3-(e), the timing margin is kept above the level at which the timing margin is zero, i.e., is kept in the state in which a positive timing margin is provided. The logic circuit 14 can thus operate properly without timing error.

In the example of the operation illustrated in FIG. 3-(a) through (e), the average value (FIG. 3-(d)) of the oscillating cycle reflecting the averaging function or integrating function of the loop filter 23 of the PLL control loop is substantially in agreement with the target oscillating cycle (FIG. 3-(b)) of the PLL control loop. This result is attributable to the fact that an increase in the average value of the oscillating cycle in response to the addition of the detection signal Q to the input of the digitally controlled oscillator 20 matches the increase in the target oscillating cycle, and it is not the case that the average value of the oscillating cycle follows the target oscillating cycle due to the operation of the PLL control loop. Because an increase in the average value of the oscillating cycle caused by the addition of the detection signal Q matches the increase in the target oscillating cycle, the PLL control loop is set in a stable state (i.e., the state in which the phase is locked), so that the agreement between the waveform 52 of FIG. 3-(b) and the waveform 54 of FIG. 3-(d) continues to be maintained.

Figure 4:
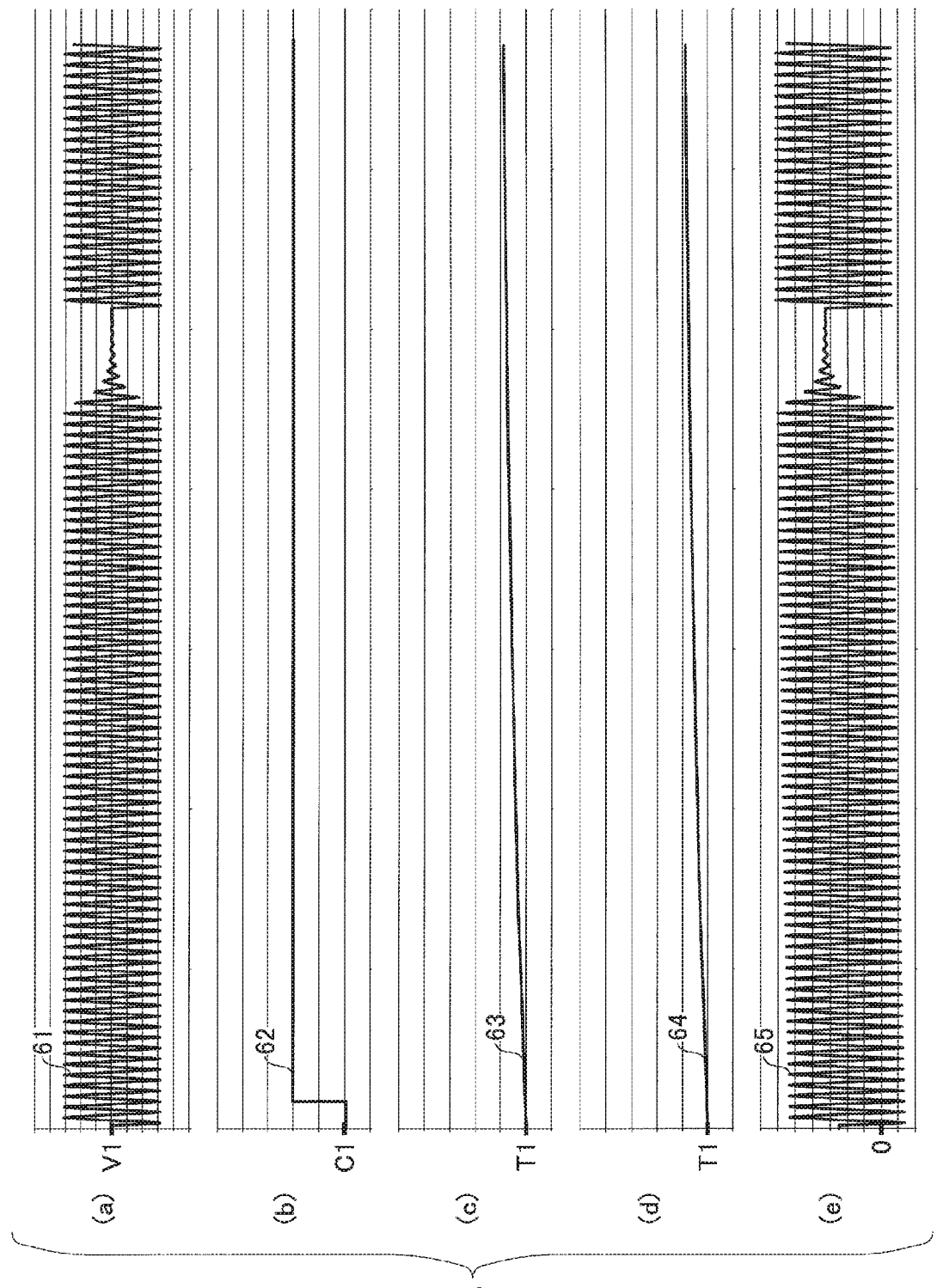
FIG. 4 is a drawing illustrating an operation performed by the PLL circuit illustrated in FIG. 1 in response to continuing changes in the power supply voltage VDD.

FIG. 4 is a drawing illustrating an operation performed by the PLL circuit illustrated in FIG. 1 in response to continuing changes in the power supply voltage VDD. Each waveform illustrated in FIG. 4 demonstrates an operation performed by the PLL circuit in response to continuing changes of the power supply voltage VDD when the addition operation of the adder 25 for adding the detection signal Q from the AD converter 11 to the signal input into the digitally controlled oscillator 20 is suspended in the PLL circuit illustrated in FIG. 1. The signals shown in FIG. 4-(a) through (e) are the same as the signals illustrated in FIG. 3-(a) through (e).

The waveform 61 of the power supply voltage VDD illustrated in FIG. 4-(a) causes the average of the power supply voltage VDD to be continuously below the predetermined voltage V1. Because of this, the target oscillating cycle of the PLL control loop, i.e., the oscillating cycle corresponding to the frequency-division ratio set to the frequency divider 21, is elongated. Namely, the target oscillating cycle of the PLL control loop increases as shown by a waveform 62 in FIG. 4-(b).

As a result of the increase in the target oscillating cycle of the PLL control loop as illustrated in FIG. 4-(b), the oscillating cycle of the digitally controlled oscillator 20 changes as shown by a waveform 63 in FIG. 4-(c). Moreover, an average value of the oscillating cycle reflecting the averaging function or integrating function of the loop filter 23 in the control loop (i.e., phase synchronization loop) of the PLL changes as shown by a waveform 64 in FIG. 4-(d).

In this example, the average value (FIG. 4-(d)) of the oscillating cycle reflecting the averaging function or integrating function of the loop filter 23 of the PLL control loop gradually increases in such a manner as to follow an increase in the target oscillating cycle (FIG. 4-(d)) of the PLL control loop. This is because the oscillating cycle is changed by the operation of the PLL control loop such that the average value of the oscillating cycle follows the target oscillating cycle. As was previously described, the example of an operation illustrated in FIG. 4-(a) through (e) demonstrates the operation performed by the PLL circuit when the addition operation of the adder 25 for adding the detection signal Q from the AD converter 11 to the signal input into the digitally controlled oscillator 20 is suspended. The oscillating cycle of the PLL circuit 10 illustrated in FIG. 4-(c) does not exhibit high-speed changes responding to sudden changes in the power supply voltage, unlike the oscillating cycle illustrated in FIG. 3-(c).

The timing margin obtained by canceling the effect of the change of the power supply voltage VDD with the effect of the adjustment of the clock cycle is equal to a sum obtained by adding the waveform 61 of FIG. 4-(a) and the waveform 63 of FIG. 4-(c) together after some size adjustment, and may have a waveform such as a waveform 65 illustrated in FIG. 4-(e). As shown by the waveform 65 in FIG. 4-(e), the oscillating cycle is unable quickly to respond to changes in the power supply voltage VDD for a certain length of time after changes in the power supply voltage VDD start to appear. This results in a situation in which the timing margin drops below zero. Consequently, the logic circuit 14 of the electronic circuit illustrated in FIG. 1 may not be able to properly operate due to timing error. Subsequently, the oscillating cycle of the PLL circuit 10 gradually increases due to the control operation of the PLL control loop, and so does the timing margin, resulting in a situation in which the timing margin is continuously kept above the zero level.

As illustrated in FIG. 4-(a) through (e), changing the frequency-division ratio of the frequency divider 21 in response to the detection signal Q supplied from the AD converter 11 does not suffice to cause the oscillating cycle to exhibit a quick change responsive to a sudden change in the power supply voltage VDD. As a result, a timing margin becomes insufficient, causing a timing error to occur in the data paths in the logic circuit 14. Accordingly, it is preferable to perform, in addition to the operation to control the frequency-division ratio, the operation to add the detection signal Q from the AD converter 11 to the signal input into the digitally controlled oscillator 20 by use of the adder 25 as in the PLL circuit 10 illustrated in FIG. 1, thereby directly changing the oscillating cycle of the digitally controlled oscillator 20.

Figure 5:
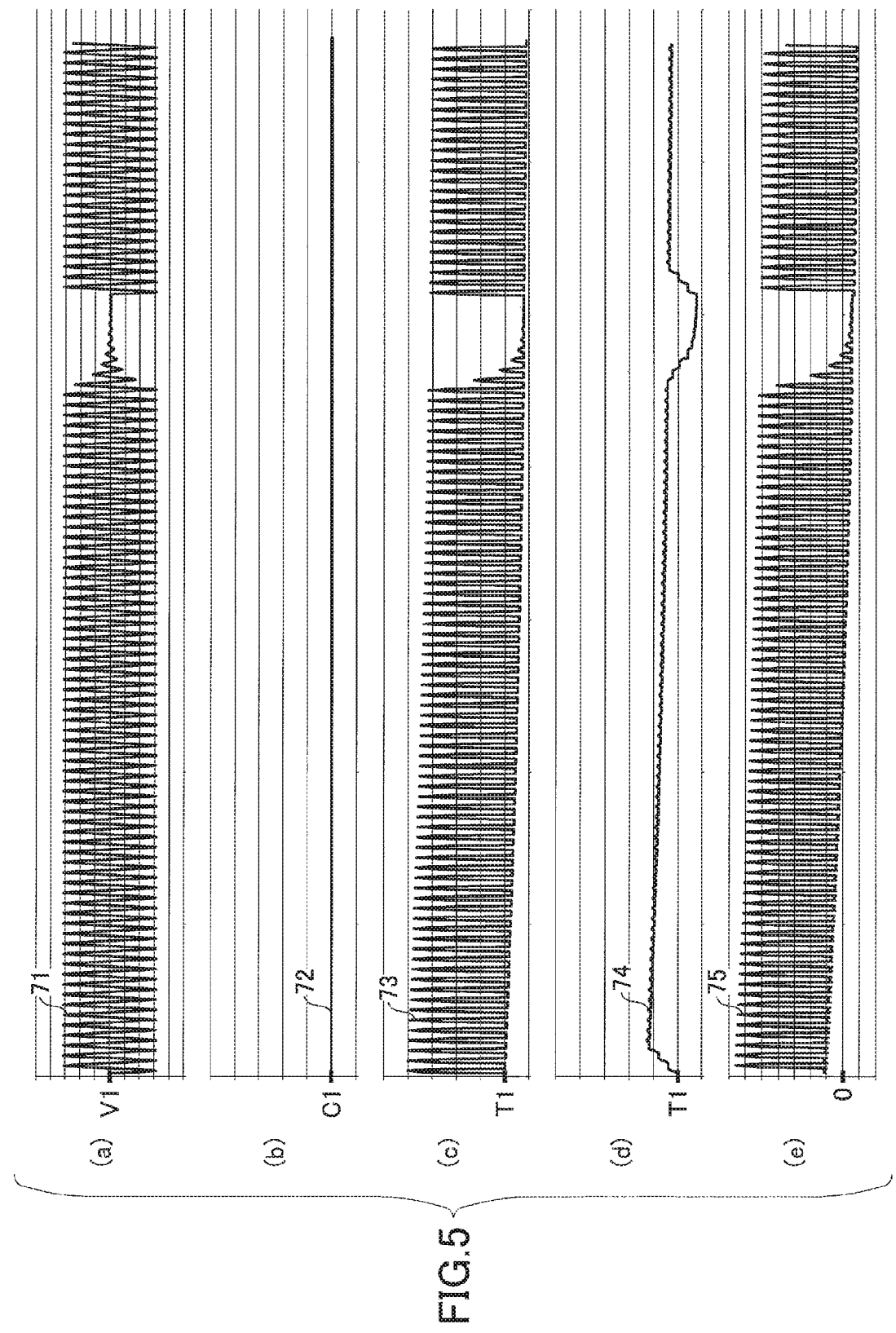
FIG. 5 is a drawing illustrating an operation performed by the PLL circuit illustrated in FIG. 1 in response to continuing changes in the power supply voltage VDD.

FIG. 5 is a drawing illustrating an operation performed by the PLL circuit illustrated in FIG. 1 in response to continuing changes in the power supply voltage VDD. Each waveform illustrated in FIG. 5 demonstrates an operation performed by the PLL circuit in response to continuing changes of the power supply voltage VDD when the operation to adjust the frequency-division ratio of the frequency divider 21 in response to the detection signal Q from the AD converter 11 is suspended in the PLL circuit illustrated in FIG. 1. The signals shown in FIG. 5-(a) through (e) are the same as the signals illustrated in FIG. 3-(a) through (e).

With a waveform 71 of the power supply voltage VDD illustrated in FIG. 5-(a), the power supply voltage VDD continues to have an average thereof situated below the desired voltage V1. The operation illustrated in FIG. 5-(a) through (e) is directed to a case in which the operation to adjust the target oscillating cycle of the PLL control loop is suspended. As shown by a waveform 72 in FIG. 5-(b), thus, the target oscillating cycle of the PLL control loop stays at the same level C1.

In response to the voltage drops as shown by the waveform 71 of FIG. 5-(a), the digital code input into the digitally controlled oscillator 20 increases due to the addition operation of the adder 25, thereby causing the oscillating cycle of the digitally controlled oscillator 20 to be changed as shown by a waveform 73 in FIG. 5-(c). Moreover, an average value of the oscillating cycle reflecting the averaging function or integrating function of the loop filter 23 in the control loop (i.e., phase synchronization loop) of the PLL changes as shown by a waveform 74 in FIG. 5-(d).

In this example of an operation, the oscillating cycle increases by promptly responding to changes in the power supply voltage as shown by the waveform 73 in FIG. 5-(c), so that the average value (FIG. 5-(d)) of the oscillating cycle reflecting the averaging or integrating function of the loop filter 23 of the PLL control loop also initially exhibits an increase. After this, however, the average value of the oscillating cycle gradually decreases as shown by the waveform 74 in FIG. 5-(d), such that the average value approaches a cycle T1 which corresponds to the constant level C1 of the target oscillating cycle (FIG. 5-(b)) of the PLL control loop. This is because the oscillating cycle is changed by the operation of the PLL control loop such that the average value of the oscillating cycle approaches the target oscillating cycle.

The timing margin obtained by canceling the effect of the change of the power supply voltage VDD with the effect of the adjustment of the clock cycle is equal to a sum obtained by adding the waveform 71 of FIG. 5-(a) and the waveform 73 of FIG. 5-(c) together after some size adjustment, and may have a waveform such as a waveform 75 illustrated in FIG. 5-(e). As shown by the waveform 75 in FIG. 5-(e), the oscillating cycle quickly respond to changes in the power supply voltage VDD, so that the timing margin is kept above the zero level for a certain length of time after changes in the power supply voltage VDD start to appear. Subsequently, however, the oscillating cycle of the PLL circuit 10 gradually decreases due to the control operation of the PLL control loop, and so does the timing margin, resulting in a situation in which the timing margin falls below the zero level. Consequently, the logic circuit 14 of the electronic circuit illustrated in FIG. 1 may not be able to properly operate due to timing error.

In an arrangement illustrated in FIG. 5-(a) through (e), the oscillating cycle of the digitally controlled oscillator 20 is directly changed by adding a signal supplied from outside the PLL loop to the signal input into the digitally controlled oscillator 20. The use of such an arrangement alone, however, ends up having the average oscillating cycle that is different from target oscillating cycle In the case in which the changes as illustrated in FIG. 5-(a) occur in the power supply voltage VDD, thus, the oscillating cycle decreases due to the operation of the PLL control loop, thereby giving rise to a risk of having a timing error after the passage of a prolonged time period following the start of occurrence of the changes. Accordingly, it is preferable to control the frequency-division ratio in addition to directly changing the oscillating cycle of the digitally controlled oscillator 20 by adding a signal supplied from outside the PLL loop to the signal input into the digitally controlled oscillator 20 as in the case of the PLL circuit 10 illustrated in FIG. 1.

As has been described heretofore, the electronic circuit illustrated in FIG. 1 has the oscillating cycle of the digitally controlled oscillator 20 that increases in response to an increase in the digital code of the detection signal Q output from the AD converter 11 when the power supply voltage VDD drops. In this case, the digital code of the detection signal Q output from the AD converter 11 may increase by one LSB in response to a drop of ΔV in the power supply voltage VDD, which may in turn cause the oscillating cycle to be elongated by ΔTo. Further, a drop of ΔV in the power supply voltage VDD may cause the time required for a signal to propagate through the data path 30 of the logic circuit 14 to increase by ΔTp. In such a case, the ΔTo increase in the oscillating cycle responding to the 1-LSB increase in the detection signal Q is preferably greater than or equal to the ΔTp increase in the signal propagation time of the data path 30. In order to achieve the maximum operating speed in addition to avoiding timing error, the ΔTo increase in the oscillating cycle responding to the 1-LSB increase in the detection signal Q is preferably equal to the ΔTp increase in the signal propagation time of the data path 30. It is thus preferable to adjust the size of a change in the oscillating cycle of the digitally controlled oscillator 20 with respect to a change of 1 LSB in the input digital code, i.e., to adjust the sensitivity of the controlled oscillating cycle.

The configuration illustrated in FIG. 1 has the AD converter 11 serving as a voltage detector and producing the detection signal Q. The voltage detector for producing the detection signal Q is not limited to one that has an AD conversion function for converting an analog power supply voltage into a digital detection signal Q. The voltage detector may measure a circuit delay caused by a change in the power supply voltage to produce a measurement value indicative of this circuit delay as the detection signal Q.

Figure 6:
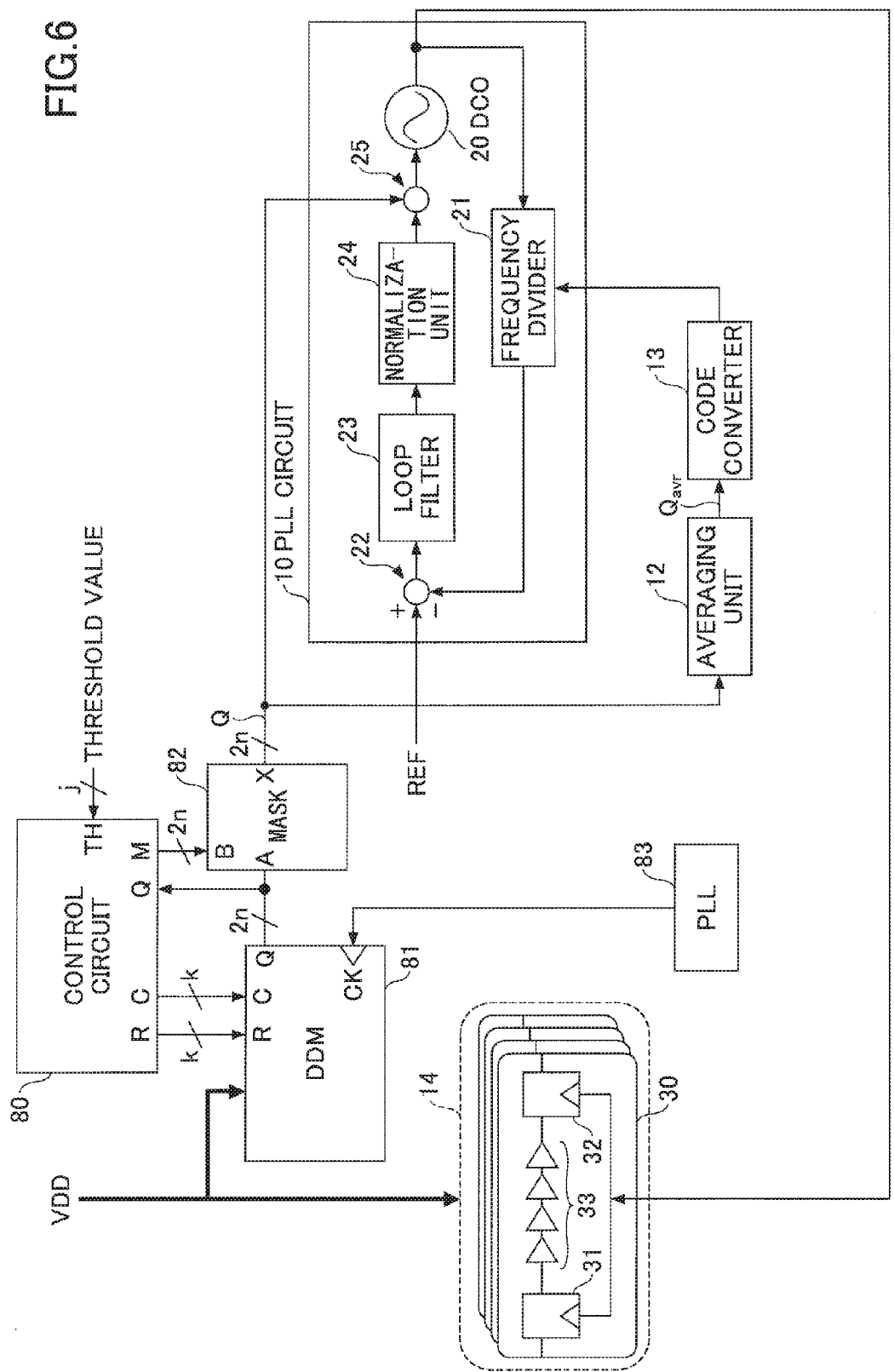
FIG. 6 is a drawing illustrating an example of an embodiment of an electronic circuit configured to change oscillating frequency based on the circuit-delay measurement in such a manner as to follow voltage noise.

FIG. 6 is a drawing illustrating an example of the configuration of an electronic circuit that utilizes a voltage detector configured to generate a detection signal Q based on circuit-delay measurements and that can create a change in the oscillating frequency that follows voltage noise. In FIG. 6, the same or corresponding elements as those of FIG. 1 are referred to by the same or corresponding numerals, and a description thereof will be omitted as appropriate.

The electronic circuit illustrated in FIG. 6 includes, in place of the AD converter 11 in FIG. 1, a control circuit 80, a delay monitor circuit (DDM) 81, a mask circuit (MASK)

82, and a PLL circuit 83. The control circuit 80, the delay monitor circuit 81, and the mask circuit 82 together constitute a voltage detector.

The control circuit 80 serves to control the delay monitor circuit 81 and the mask circuit 82. The control circuit 80 supplies, to the delay monitor circuit 81, a first control signal C and a second control signal R, each of which is of k bits (k: an integer that is two or greater), and also supplies, to the mask circuit 82, a mask signal M which is of 2n bits (n: an integer that is one or greater). The delay monitor circuit 81 measures, based on a clock signal, a difference in the circuit delay between two variable delay lines whose delay lengths are set by the first control signal C and the second control signal R, respectively, followed by outputting the result of the measurement as a circuit-delay measurement value. These two variable delay lines are driven by the power supply voltage VDD and a reference voltage VREF, respectively. A change in a difference in the circuit delay between the two variable delay lines serves to indicate a change in the power supply voltage VDD. The mask circuit 82 masks a circuit-delay measurement value of 2n bits output from the delay monitor circuit 81 by use of the mask signal M, thereby outputting a masked circuit-delay measurement value of 2n bits. The masked circuit-delay measurement value is supplied to the PLL circuit 10 and to the averaging unit 12 as the detection signal Q.

The clock signal used by the delay monitor circuit 81 may be applied by the PLL circuit 83 to a clock input terminal CK of the delay monitor circuit 81. This clock signal will hereinafter be referred to as a clock signal CK. The delay monitor circuit 81 measures a circuit delay based on a difference between the respective time lengths for a clock signal to propagate through the two variable delay lines. In so doing, one of a plurality of clock pulses of the clock signal CK is used for the measurement of one circuit delay. It thus suffices to supply a single pulse signal to the delay monitor circuit 81 for the purpose of measuring one circuit delay. Supply of a plurality of clock pulses to the delay monitor circuit 81 allows a plurality of circuit delay measurements to be performed successively. A circuit-delay measurement value is thus not dependent on the frequency of the clock signal CK. The frequency of the clock signal CK may be set simply as a factor that defines a sampling period used for measuring circuit delays.

Figure 7:
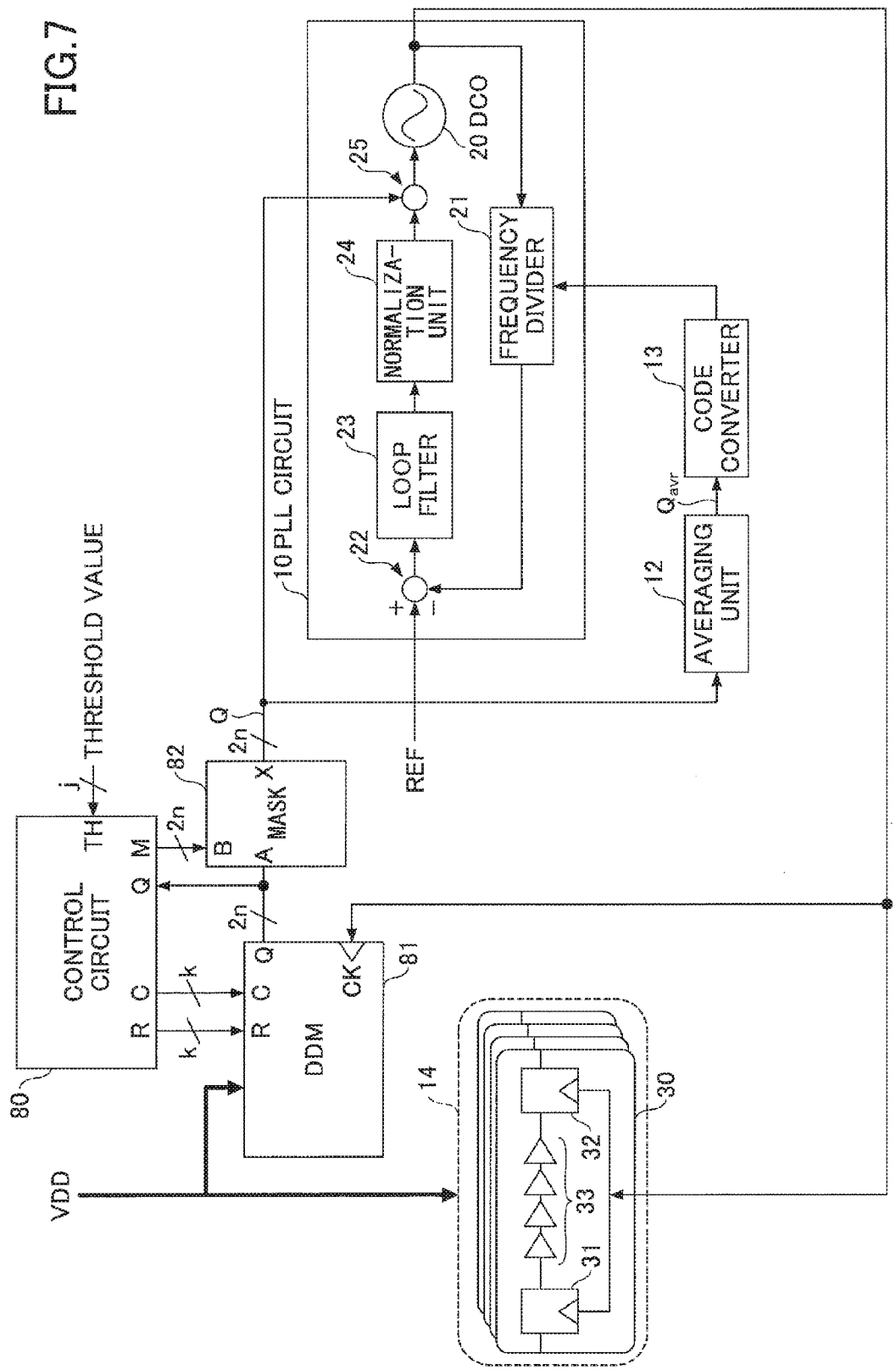
FIG. 7 is a drawing illustrating a variation of the electronic circuit illustrated in FIG. 6.

FIG. 7 is a drawing illustrating a variation of the electronic circuit illustrated in FIG. 6. The electronic circuit illustrated in FIG. 7 has the delay monitor circuit 81 that uses the clock signal CK supplied from the PLL circuit 10. Namely, the clock signal generated by the digitally controlled oscillator 20 of the PLL circuit 10 and supplied to the logic circuit 14 is also applied to the clock input terminal CK of the delay monitor circuit 81. As was previously described, a circuit-delay measurement value output from the delay monitor circuit 81 is not dependent on the frequency of the clock signal applied to the clock input terminal CK. Accordingly, despite the fact that the oscillating frequency of the PLL circuit 10 changing as an object of control is applied to the clock input terminal CK, a circuit-delay measurement value produced by the delay monitor circuit 81 does not end up changing as a result of control performed by the PLL circuit 10. Namely, the delay monitor circuit 81 is able to detect a change in the power supply voltage VDD without being affected by a change in the oscillating frequency of the PLL circuit 10. The use of the configuration of the electronic circuit illustrated in FIG. 7 serves to reduce the number of PLL circuits, compared to the configuration of the electronic circuit illustrated in FIG. 6.

Figure 8:
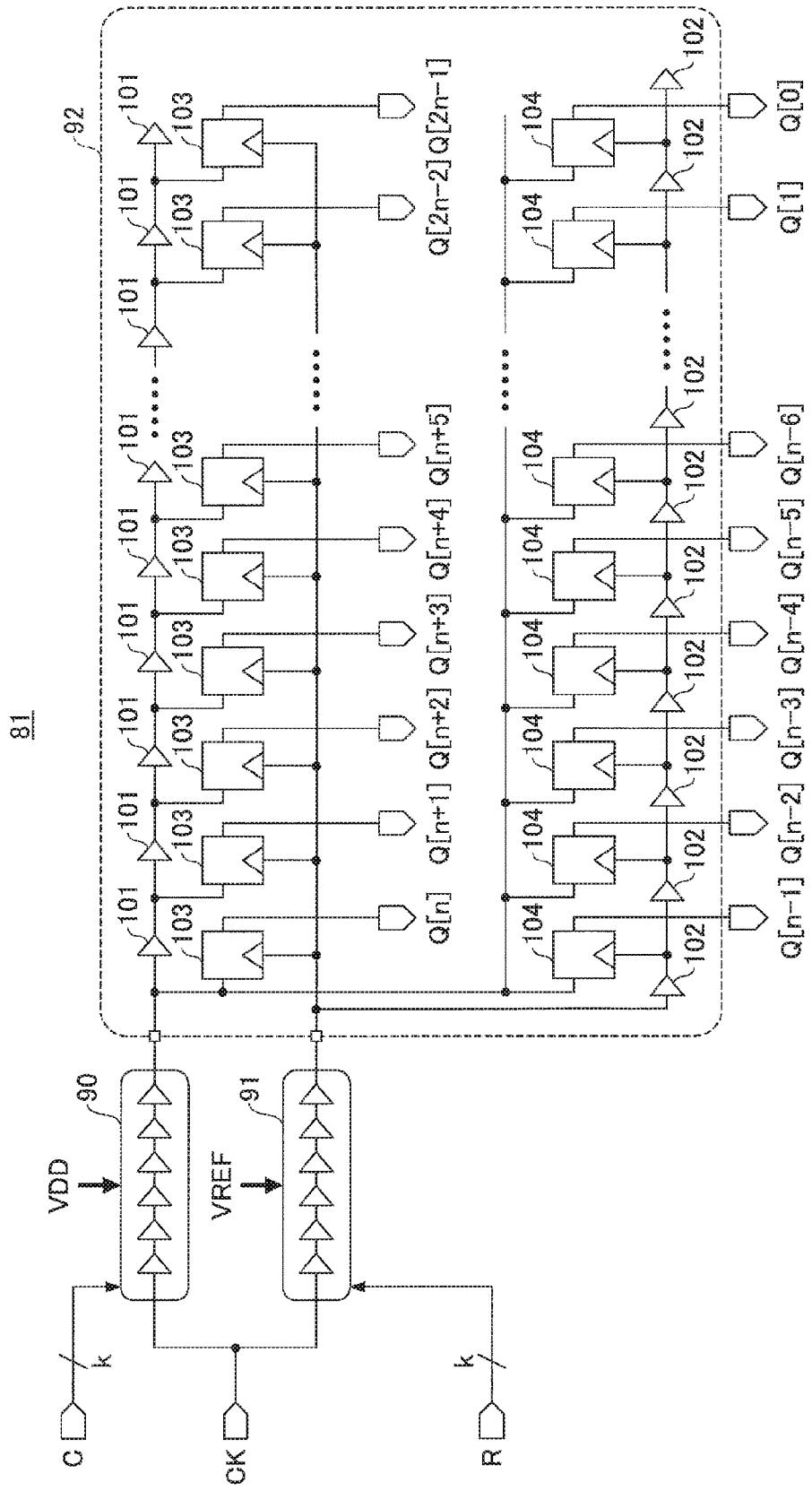
FIG. 8 is a drawing illustrating an example of the configuration of a display monitor circuit.

FIG. 8 is a drawing illustrating an example of the configuration of the delay monitor circuit 81. The delay monitor circuit 81 illustrated in FIG. 8 includes a first variable delay line 90, a second variable delay line 91, and a time-difference measuring circuit 92.

The first variable delay line 90 receives the power supply voltage VDD, and outputs a first delayed oscillating signal obtained by delaying the clock signal CK based on the first control signal C. The second variable delay line 91 receives the reference voltage VREF, and outputs a second delayed oscillating signal obtained by delaying the clock signal CK based on the second control signal R.

The time-difference measuring circuit 92 includes a plurality of delay circuits 101, a plurality of delay circuits 102, n first flip-flops 103, and n second flip-flops 104. The first flip-flops 103 receive at the respective clock terminals thereof the second delayed oscillating signal that is output from the second variable delay line 91. The data input terminals of the first flip-flops 103 receive the first delayed oscillating signal having respective delays relative to the first delayed oscillating signal at the output of the first variable delay line 90, such that the respective delays are created by the delay circuits 101 each of which imposes a first predetermined delay length between two adjacent data input terminals of the first flip-flops 103.

The second flip-flops 104 receive at the respective data input terminals thereof the first delayed oscillating signal that is output from the first variable delay line 90. The clock terminals of the second flip-flops 104 receive the second delayed oscillating signal having respective delays relative to the second delayed oscillating signal at the output of the second variable delay line 91, such that the respective delays are created by the delay circuits 102 each of which imposes a second predetermined delay length between two adjacent clock terminals of the second flip-flops 104. The delay time of each of the delay circuits 101 and the delay time of each of the delay circuits 102 may be the same. Namely, the first predetermined delay length and the second predetermined delay length may be equal to each other.

A circuit-delay measurement value Q[2n−1:0] of 2n bits that is output from the time-difference measuring circuit 92 has the n upper-order bits thereof equal to the n-bit outputs of the n first flip-flops 103 and has the n lower-order bits thereof equal to the n-bit outputs of the n second flip-flops 104. When the first variable delay line 90 and the second variable delay line 91 have the same delay time, the circuit-delay measurement value Q[2n−1:0] has the n upper-order bits thereof being all zero and the n lower-order bits thereof being all 1. The circuit-delay measurement value Q[2n−1:0] having the above-noted value is denoted as {n'b00 . . . 00, n'b11 . . . 11}. In the case n being 4, for example, such a circuit-delay measurement value Q[7:0] is equal to "00001111".

When the circuit delay of the first variable delay line 90 is longer than the circuit delay of the second variable delay line 91, the first delayed oscillating signal produced by the first variable delay line 90 is delayed relative to the second delayed oscillating signal produced by the second variable delay line 91. In such a case, the second flip-flop 104 that is situated at the leftmost position among the n second flip-flops 104 illustrated in FIG. 8 loads the first delayed oscillating signal as the data input thereof before the first delayed oscillating signal becomes HIGH. Consequently, some of the n output bits of the n second flip-flops 104 are set to 0 rather than set to 1. The difference in the circuit delay between the first variable delay line 90 and the second variable delay line 91 may be greater than three times the previously-noted predetermined delay length and smaller than four times the predetermined delay length, for example. In such a case, the circuit-delay measurement value Q[7:0] in the case of n being 4 is equal to "00000001". The difference in the circuit delay between the first variable delay line 90 and the second variable delay line 91 may be greater than twice the previously-noted predetermined delay length and smaller than three times the predetermined delay length, for example. In such a case, the circuit-delay measurement value Q[7:0] in the case of n being 4 is equal to "00000011".

When the circuit delay of the first variable delay line 90 is shorter than the circuit delay of the second variable delay line 91, the first delayed oscillating signal produced by the first variable delay line 90 is advanced relative to the second delayed oscillating signal produced by the second variable delay line 91. In such a case, the first flip-flop 103 that is situated at the leftmost position among the n first flip-flops 103 illustrated in FIG. 8 loads the first delayed oscillating signal as the data input thereof after the first delayed oscillating signal becomes HIGH. Consequently, some of the n output bits of the n first flip-flops 103 are set to 1 rather than set to 0. The difference in the circuit delay between the first variable delay line 90 and the second variable delay line 91 may be greater than three times the previously-noted predetermined delay length and smaller than four times the predetermined delay length, for example. In such a case, the circuit-delay measurement value Q[7:0] in the case of n being 4 is equal to "01111111". The difference in the circuit delay between the first variable delay line 90 and the second variable delay line 91 may be greater than twice the previously-noted predetermined delay length and smaller than three times the predetermined delay length, for example. In such a case, the circuit-delay measurement value Q[7:0] in the case of n being 4 is equal to "01111111".

In the circuit configuration illustrated in FIG. 8, the output of the first variable delay line 90 is applied to the data input terminals of the flip-flops 103 and 104, and the output of the second variable delay line 91 is applied to the clock terminals of the flip-flops 103 and 104. Conversely, the output of the first variable delay line 90 may be applied to the clock terminals of the flip-flops 103 and 104, and the output of the second variable delay line 91 may be applied to the data input terminals of the flip-flops 103 and 104. In such a case, a change in the circuit-delay measurement value Q[2n−1:0] in response to a change in a difference in the circuit delay between the first variable delay line 90 and the second variable delay line 91 is reversed from what was stated above. Modification may then be made to the design of control operation based on the circuit-delay measurement value Q by taking into account such reversal.

In the manner described above, the delay monitor circuit 81 produces the circuit-delay measurement value Q[2n−1:0] that is a thermometer code indicative of a difference in the circuit delay between the first variable delay line 90 and the second variable delay line 91. The first variable delay line 90 is driven by the power supply voltage VDD, and the second variable delay line 91 is driven by the reference voltage VREF. The reference voltage VREF, which is a power supply voltage supplied from an external source independently of the power supply voltage VDD, is not used by other circuit portions of the electronic circuit illustrated in FIG. 6 or FIG. 7. The reference voltage VREF is free of noise and maintained at a constant voltage level, without fluctuation. Accordingly, the circuit-delay measurement value Q[2n−1:0] indicative of a difference in the circuit delay between the first variable delay line 90 and the second variable delay line 91 serves uniquely to reflect a value of the power supply voltage VDD. A drop in the power supply voltage VDD causes the circuit delay of the first variable delay line 90 to become longer, and a rise in the power supply voltage VDD causes the circuit delay of the first variable delay line 90 to become shorter. A drop in the power supply voltage VDD thus causes the number of bits having a value of 0 to increase in the circuit-delay measurement value Q[2n−1:0], and a rise in the power supply voltage VDD causes the number of bits having a value of 1 to increase in the circuit-delay measurement value Q[2n−1:0]

Despite the desire to manufacture a circuit such that the circuit delay of the first variable delay line 90 and the circuit delay of the second variable delay line 91 have the same length, the provision of the same length is difficult due to process variation and placement variation. In consideration of this, an initialization process may be performed in advance such as to set the circuit delay of the first variable delay line 90 and the circuit delay of the second variable delay line 91 to the same length. This initialization process will be described later.

Figure 9:
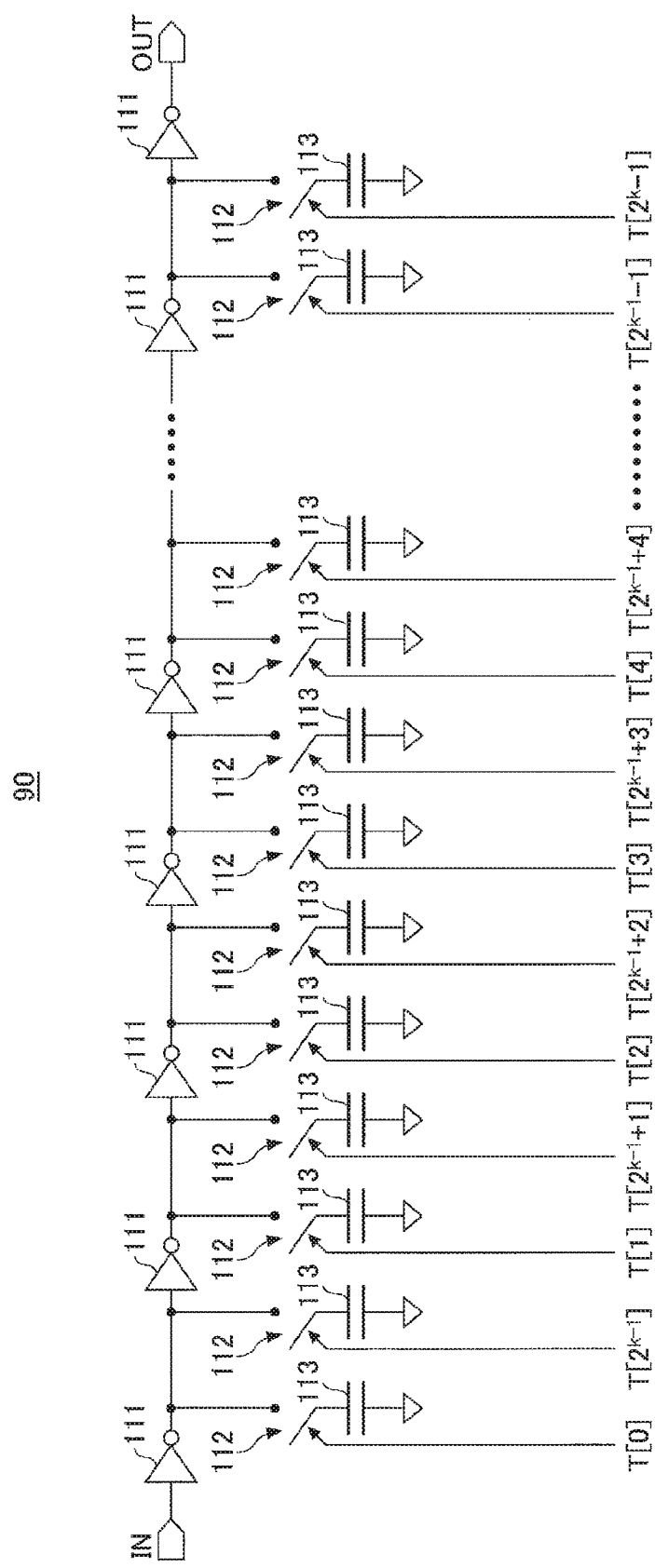
FIG. 9 is a drawing illustrating an example of the configuration of a variable delay line.

FIG. 9 is a drawing illustrating an example of the configuration of a variable delay line. Each of the first variable delay line 90 and the second variable delay line 91 illustrated in FIG. 8 may include the circuit configuration of the variable delay line illustrated in FIG. 9. The variable delay line illustrated in FIG. 9 includes a plurality of inverters 111, $2^k$ switch circuits 112, and a plurality of capacitor elements 113. The inverters 111 are connected in series to form a delay line. The $2^k$ switch circuits 112 receive the respective bits of a switch control code T[0] through T[$2^k$−1]. Each of the switch circuits 112 becomes conductive when the value of the corresponding bit of the applied switch control code is 1, so that the capacitor element 113 connected in series with the switch circuit 112 of interest is coupled to the output of the inverter 111 of interest. Each of the switch circuits 112 becomes nonconductive when the value of the corresponding bit of the applied switch control code is 0, so that the capacitor element 113 connected in series with the switch circuit 112 of interest is disconnected from the output of the inverter 111 of interest.

The larger the number of bits having a value of 1 in the switch control code T[0] through T[$2^k$−1] is, the larger the number of capacitor elements 113 coupled to the delay line illustrated in FIG. 9 is, thereby creating the longer delay time. The larger the number of bits having a value of 0 in the switch control code T[0] through T[$2^k$−1] is, the smaller the number of capacitor elements 113 coupled to the delay line illustrated in FIG. 9 is, thereby creating the shorter delay time.

Figure 10:
FIG. 10 is a drawing illustrating a code converting unit that performs code conversion for a variable delay line.

FIG. 10 is a drawing illustrating a code converting unit that performs code conversion for a variable delay line. Each of the first variable delay line 90 and the second variable delay line 91 illustrated in FIG. 8 may include the code converting unit illustrated in FIG. 10. A code converting unit 115 illustrated in FIG. 10 receives a first control signal C[k−1:0] of k bits corresponding to the first variable delay line 90, for example. The code converting unit 115 generates a $2^k$-bit thermometer code in which the number of bits having a value of 1 is equal to the value between 0 and $2^k$−1 that is specified by the first control signal C[k−1:0]. The first control signal C[3:0] may be "1011" indicating a decimal number of 11, for example. In such a case, the output T[0] through T[15] of the code converting unit 115 is equal to "1111111111100000" in which 11 bits have a value of 1 among a total of 16 bits. A similar code converting unit may convert the second control signal R[k−1:0] into $2^k$-bit thermometer code in a similar manner for the second variable delay line 91.

Figure 11:
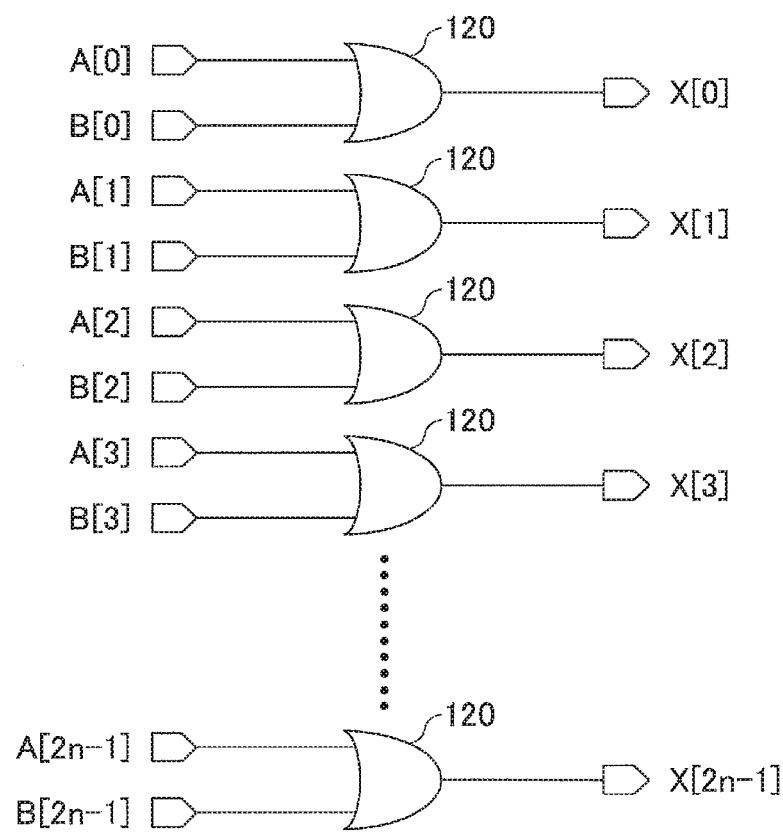
FIG. 11 is a drawing illustrating an example of the configuration of a mask circuit.

FIG. 11 is a drawing illustrating an example of the configuration of the mask circuit 82 illustrated in FIG. 6 or FIG. 7. The mask circuit 82 illustrated in FIG. 6 or FIG. 7 receives at the A input thereof the circuit-delay measurement value Q[2n−1:0] of 2n bits from the delay monitor circuit 81, and also receives at the B input thereof the mask signal M of 2n bits from the control circuit 80. In FIG. 11, a 2n-bit signal received at the A input is denoted as A[0] through A[2n−1], and a 2n-bit signal received at the B input is denoted as B[0] through B[2n−1].

The mask circuit illustrated in FIG. 11 includes n OR gates 120. Outputs X[0] through X[2n−1] of the n OR gates 120 are output from the mask circuit as the masked circuit-delay measurement value of 2n bits. Each of the OR gates 120 performs an OR operation between a corresponding 1 bit of A[0] through A[2n−1] and a corresponding 1 bit of B[0] through B[2n−1], thereby outputting the result of the OR operation as a corresponding 1 bit of X[0] through X[2n−1]. In this manner, the circuit-delay measurement value Q[2n−1:0] of 2n bits are masked on a bit-by-bit basis at the bit positions corresponding to those bits of the 2n-bit mask signal M which have a value 1, thereby becoming the masked circuit-delay measurement value that is output.

Figure 12:
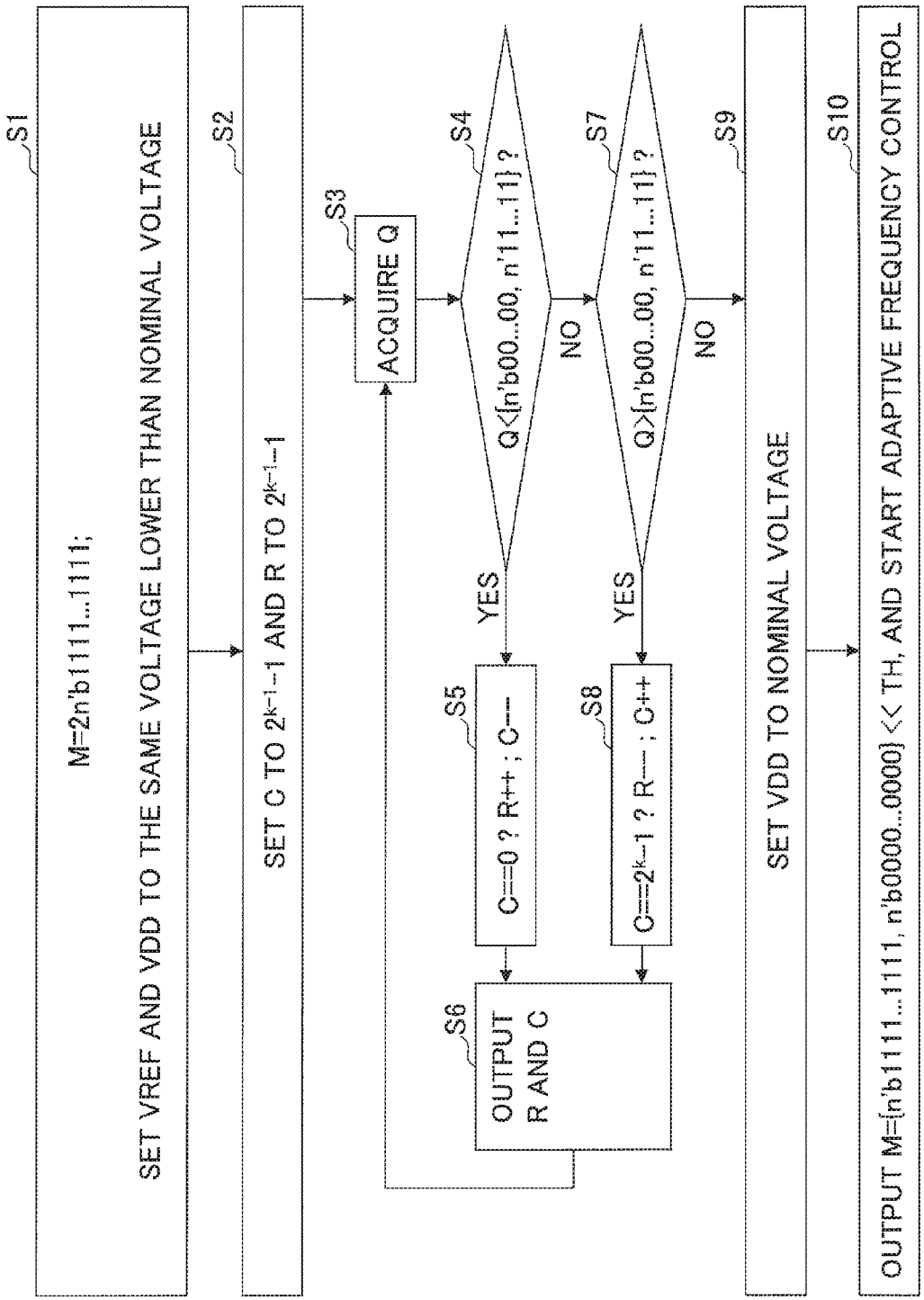
FIG. 12 is a flowchart illustrating an example of a setting operation performed by a control circuit.

FIG. 12 is a flowchart illustrating an example of a setting operation performed by a control circuit. The electronic circuit illustrated in FIG. 6 or FIG. 7 performs an initial setting procedure illustrated in the flowchart of FIG. 12 prior to the commencement of routine processes for its original purposes. In the case of the electronic circuit being a communication circuit, the initial setting procedure illustrated in the flowchart of FIG. 12 is performed prior to the commencement of communication processes by the electronic circuit. After the initial setting, the electronic circuit performs routine processes, and, also, adaptive frequency control is performed to control the oscillating frequency of the PLL circuit 10 in response to a change in the power supply voltage VDD.

In step S1, the reference voltage VREF and the power supply voltage VDD are set to the same voltage, and the control circuit 80 sets all the bits of the mask signal M to 1. In so doing, the control circuit 80 may transmit a voltage setting instruction to an external power supply source to perform the above-noted voltage setting. The voltage level to which both the reference voltage VREF and the power supply voltage VDD are set may be lower than the nominal voltage to which the power supply voltage VDD is set for the electronic circuit to perform routine operations. This voltage level may be a trigger voltage for triggering adaptive frequency control. Namely, it may be desired that a drop in the power supply voltage VDD from the nominal voltage to a predetermined voltage during routine operations initiates (triggers) the adaptive frequency control to lower the oscillating frequency of the PLL circuit 10. In such a case, such a predetermined voltage may be the above-noted voltage level. Setting all the bits of the mask signal M to 1 causes all the bits of the output of the mask circuit 82 to be fixed to 1, so that all the bits of the detection signal Q supplied to the PLL circuit 10 and the averaging unit 12 are fixed to 1. This arrangement serves to suspend the adaptive frequency control that controls the oscillating frequency of the PLL circuit 10.

In step S2, the control circuit 80 sets each of the first control signal C and the second control signal R to $2^{k-1}-1$. With this setting, each of the first variable delay line 90 and the second variable delay line 91 of the delay monitor circuit 81 is set to a delay length situated at the midpoint between the maximum delay length and the minimum delay length.

In step S3, the control circuit 80 acquires the circuit-delay measurement value Q output from the delay monitor circuit 81.

In step S4, the control circuit 80 checks whether the circuit-delay measurement value Q acquired in step S3 is smaller than {n'b00 . . . 00, n'b11 . . . 11}. Namely, a check is made as to whether the circuit delay of the first variable delay line 90 is longer than the circuit delay of the second variable delay line 91. In the case of the check result being YES, the procedure proceeds to step S5. In the case of the check result being NO, the procedure proceeds to step S7.

In step S5, the control circuit 80 increases the second control signal R by 1 in the case of the first control signal C being 0, and decreases the first control signal C by 1 in the case of the first control signal C being not 0. Namely, the control circuit 80 first changes the control signals to shorten the circuit delay of the first variable delay line 90, and then changes the control signals to elongate the circuit delay of the second variable delay line 91 after the circuit delay of the first variable delay line 90 becomes the shortest. In step S6, the control circuit 80 supplies the first control signal C and the second control signal R having been changed to the delay monitor circuit 81. Thereafter, the procedure returns to step S3, from which the subsequent steps are repeated.

In step S7, the control circuit 80 checks whether the circuit-delay measurement value Q acquired in step S3 is greater than {n'b00 . . . 00, n'b11 . . . 11}. Namely, a check is made as to whether the circuit delay of the first variable delay line 90 is shorter than the circuit delay of the second variable delay line 91. In the case of the check result being YES, the procedure proceeds to step S8. In the case of the check result being NO, the procedure proceeds to step S9.

In step S8, the control circuit 80 decreases the second control signal R by 1 in the case of the first control signal C being $2^k-1$, and increases the first control signal C by 1 in the case of the first control signal C being not $2^k-1$. Namely, the control circuit 80 first changes the control signals to elongate the circuit delay of the first variable delay line 90, and then changes the control signals to shorten the circuit delay of the second variable delay line 91 after the circuit delay of the first variable delay line 90 becomes the shortest. In step S6, the control circuit 80 supplies the first control signal C and the second control signal R having been changed to the delay monitor circuit 81. Thereafter, the procedure returns to step S3, from which the subsequent steps are repeated.

By the time the procedure reaches step S9, the circuit-delay measurement value Q has become equal to {n'b00 . . . 00, n'b11 . . . 11}. Namely, the circuit delay of the first variable delay line 90 and the circuit delay of the second variable delay line 91 have become equal to each other. In this state, the power supply voltage VDD is set to the nominal voltage (i.e., rated voltage) in step S9. In so doing, the control circuit 80 may transmit a voltage setting instruction to an external power supply source to perform the above-noted voltage setting.

In step S10, the control circuit 80 outputs the mask signal M having one or more bits thereof equal to 0, thereby starting adaptive frequency control. It may be noted that the value of the mask signal M is equal to a value obtained by shifting {n'b00 . . . 00, n'b11 . . . 11} to the left by TH bits.

TH denotes a threshold value that is set for the purpose of providing a timing margin by taking into account the time length required for the oscillating frequency of the PLL circuit 10 to complete its change under the adaptive frequency control. In the case of no need for a timing margin, TH may be set to 0. Namely, the value of the mask signal M may be equal to {n'b11 . . . 11, n'b00 . . . 00}. The initial setting process previously described and illustrated in FIG. 12 ensures that the first variable delay line 90 and the second variable delay line 91 have the same circuit delay under the condition that the power supply voltage VDD is equal to the reference voltage VREF (which is equal to the trigger voltage). In that state, the circuit-delay measurement value Q is equal to {n'b00 . . . 00, n'b11 . . . 11}. When the power supply voltage VDD aimed at the nominal voltage (which is greater than the trigger voltage) drops to the reference voltage VREF (which is equal to the trigger voltage), thus, the circuit-delay measurement value Q becomes equal to {n'b00 . . . 00, n'b11 . . . 11}. With the value of the mask signal M being equal to {n'b11 . . . 11, n'b00 . . . 00}, the detection signal Q output from the mask circuit 82 starts to change when the circuit-delay measurement value Q becomes smaller than {n'b00 . . . 00, n'b11 . . . 11}. In the electronic circuit illustrated in FIG. 6 or FIG. 7, a decrease in the value of the signal input into the digitally controlled oscillator 20 may cause the cycle of the oscillating signal of the digitally controlled oscillator 20 to increase in length. Conversely, an increase in the value of the signal input into the digitally controlled oscillator 20 may cause the cycle of the oscillating signal of the digitally controlled oscillator 20 to decrease in length. The frequency adjustment operation of the PLL circuit 10 is performed in response to a change in the value of the detection signal Q generated as described above, so that the frequency adjustment operation of the PLL circuit 10 starts when the power supply voltage VDD aimed at the nominal frequency drops below the reference voltage VREF.

It generally takes a certain time length for the clock frequency to reach a proper frequency after the start of the frequency adjustment operation of the PLL circuit 10. A prolonged time length required for the clock frequency to reach a proper frequency may give rise to a risk of a data transfer error occurring in the critical path of the logic circuit 14. In reality, therefore, a time margin may preferably be provided by taking into account the time length required for the control. In consideration of this, the mask signal M is shifted to the left by TH bits, which reduces the number of upper-order bits serving as a mask, thereby allowing the value of the detection signal Q to start changing earlier than otherwise. A delay in control is denoted as Dc [nsec], and a slope in the voltage drop is denoted as Sn [mV/nsec]. Further, the change in the power supply voltage VDD corresponding to a change of 1 LSB in the output of the delay monitor circuit 81 is denoted as h [mV]. TH may then be set to satisfy the following relationship.

$$Dc \leq (h/Sn) \cdot TH$$

Accordingly, H is a positive integer that satisfies the following relationship.

$$TH \geq (Dc \cdot Sn)/h$$

This threshold value TH may be stored in the memory of the electronic circuit, and may be transferred from the memory to the control circuit 80.

Figure 13:
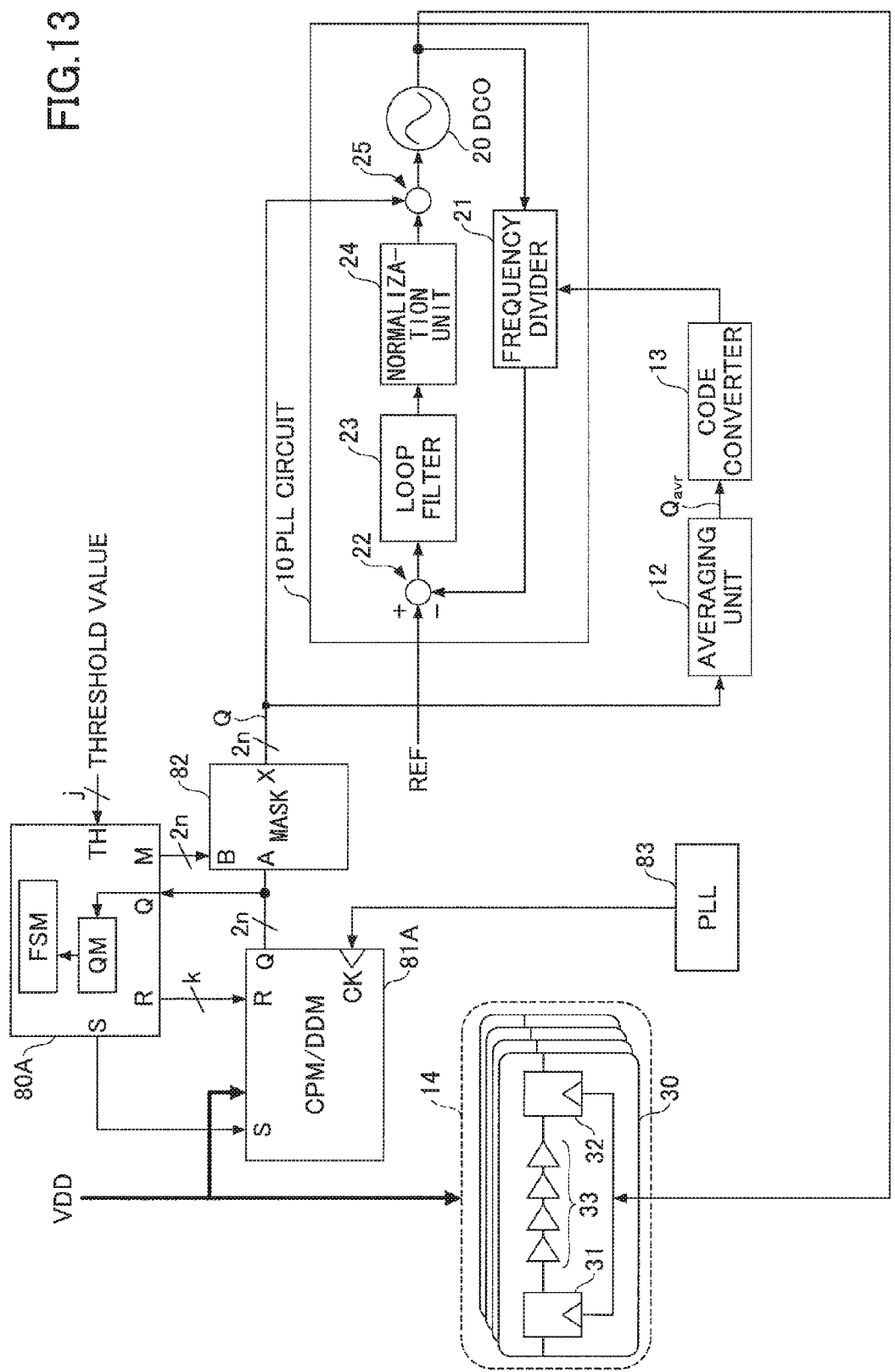
FIG. 13 is a drawing illustrating another example of an embodiment of an electronic circuit configured to change oscillating frequency based on the circuit-delay measurement in such a manner as to follow voltage noise.

FIG. 13 is a drawing illustrating another example of an embodiment of an electronic circuit configured to change oscillating frequency based on the circuit-delay measurement in such a manner as to follow voltage noise. In FIG. 13, the same or corresponding elements as those of FIG. 6 are referred to by the same or corresponding numerals, and a description thereof will be omitted as appropriate.

The electronic circuit illustrated in FIG. 13 has a control circuit 80A provided in place of the control circuit 80 of FIG. 6, and has a critical-path-monitor and delay-monitor circuit (CPM/DDM) 81A provided in place of the delay monitor circuit 81 of FIG. 6. The control circuit 80A includes a register QM and a state machine FSM. The register QM stores the circuit-delay measurement value Q of a pseudo critical path measured by the critical-path-monitor and delay-monitor circuit 81A. The state machine FSM controls the operation performed by the control circuit 80A. The critical-path-monitor and delay-monitor circuit 81A has both the function to monitor the pseudo critical path and the function to monitor a circuit delay, and will hereinafter be referred to as a delay monitor circuit 81A for the sake of convenience. The control circuit 80A, the delay monitor circuit 81A, and the mask circuit 82 together constitute a voltage detector.

The delay monitor circuit 81A measures, based on the clock signal CK, a difference in the circuit delay between the pseudo critical path and a variable delay line whose delay time length is set by the control signal R, and outputs the result of the measurement as a circuit-delay measurement value. The pseudo critical path and the variable delay line are driven by the power supply voltage VDD and the reference voltage VREF, respectively. A change in a difference in the circuit delay between the pseudo critical path and the variable delay line serves to indicate a change in the power supply voltage VDD. The configuration and operation of the delay monitor circuit 81A will be described later. Like the delay monitor circuit 81, the delay monitor circuit 81A has the circuit-delay measurement value thereof independent of the frequency of the clock signal CK.

Figure 14:
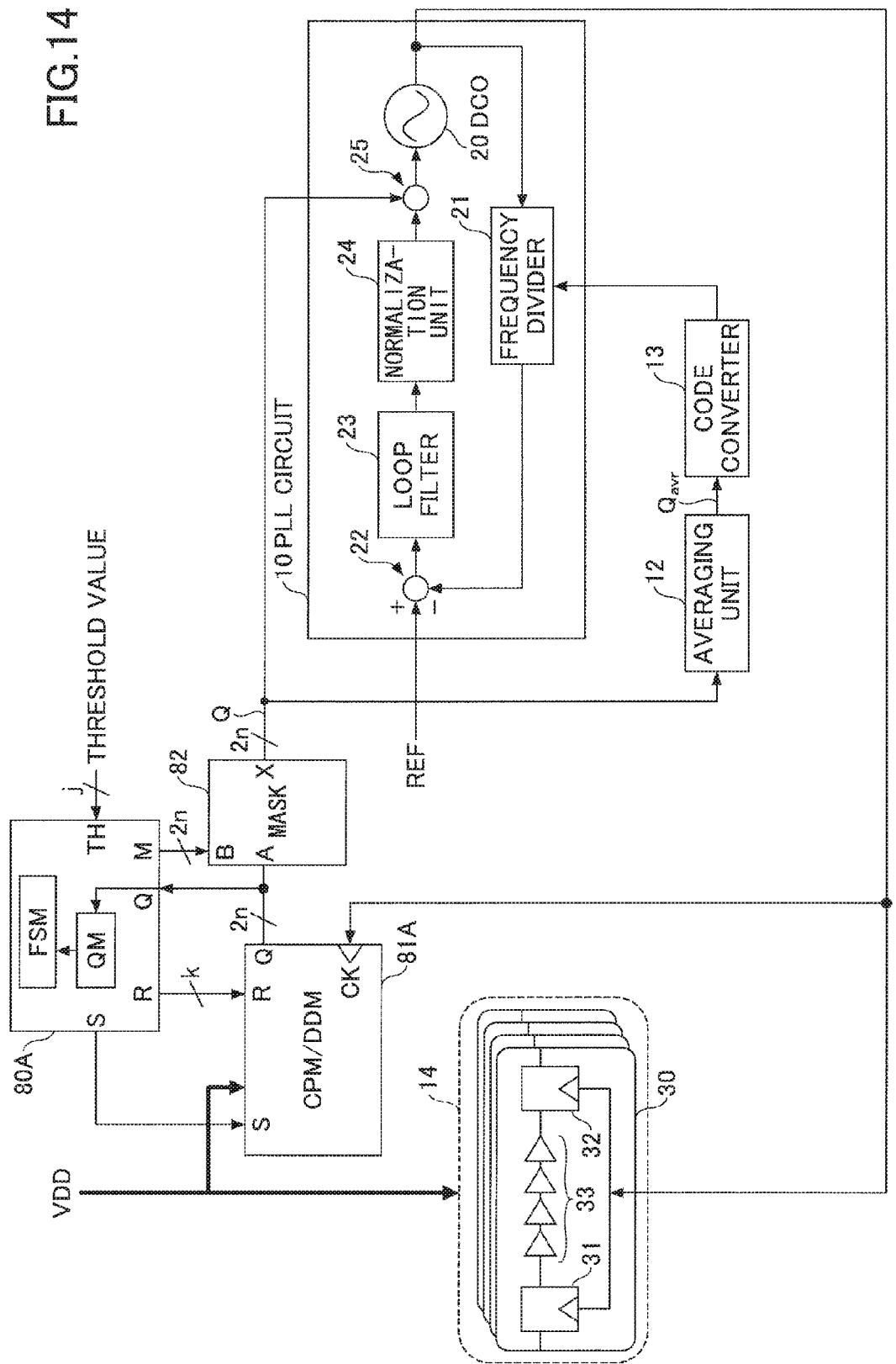
FIG. 14 is a drawing illustrating a variation of the electronic circuit illustrated in FIG. 13.

FIG. 14 is a drawing illustrating a variation of the electronic circuit illustrated in FIG. 13. The electronic circuit illustrated in FIG. 14 has the delay monitor circuit 81A that uses the clock signal CK supplied from the PLL circuit 10. As was previously described, the circuit-delay measurement value output from the display monitor circuit 81A is not dependent on the frequency of the clock signal applied to the clock input terminal CK. Accordingly, despite the fact that the oscillating frequency of the PLL circuit 10 changing as an object of control is applied to the clock input terminal CK, a circuit-delay measurement value produced by the display monitor circuit 81A does not end up changing as a result of control performed by the PLL circuit 10. Namely, the display monitor circuit 81A is able to detect a change in the power supply voltage VDD without being affected by a change in the oscillating frequency of the PLL circuit 10. The use of the configuration of the electronic circuit illustrated in FIG. 14 serves to reduce the number of PLL circuits, compared to the configuration of the electronic circuit illustrated in FIG. 13.

Figure 15:
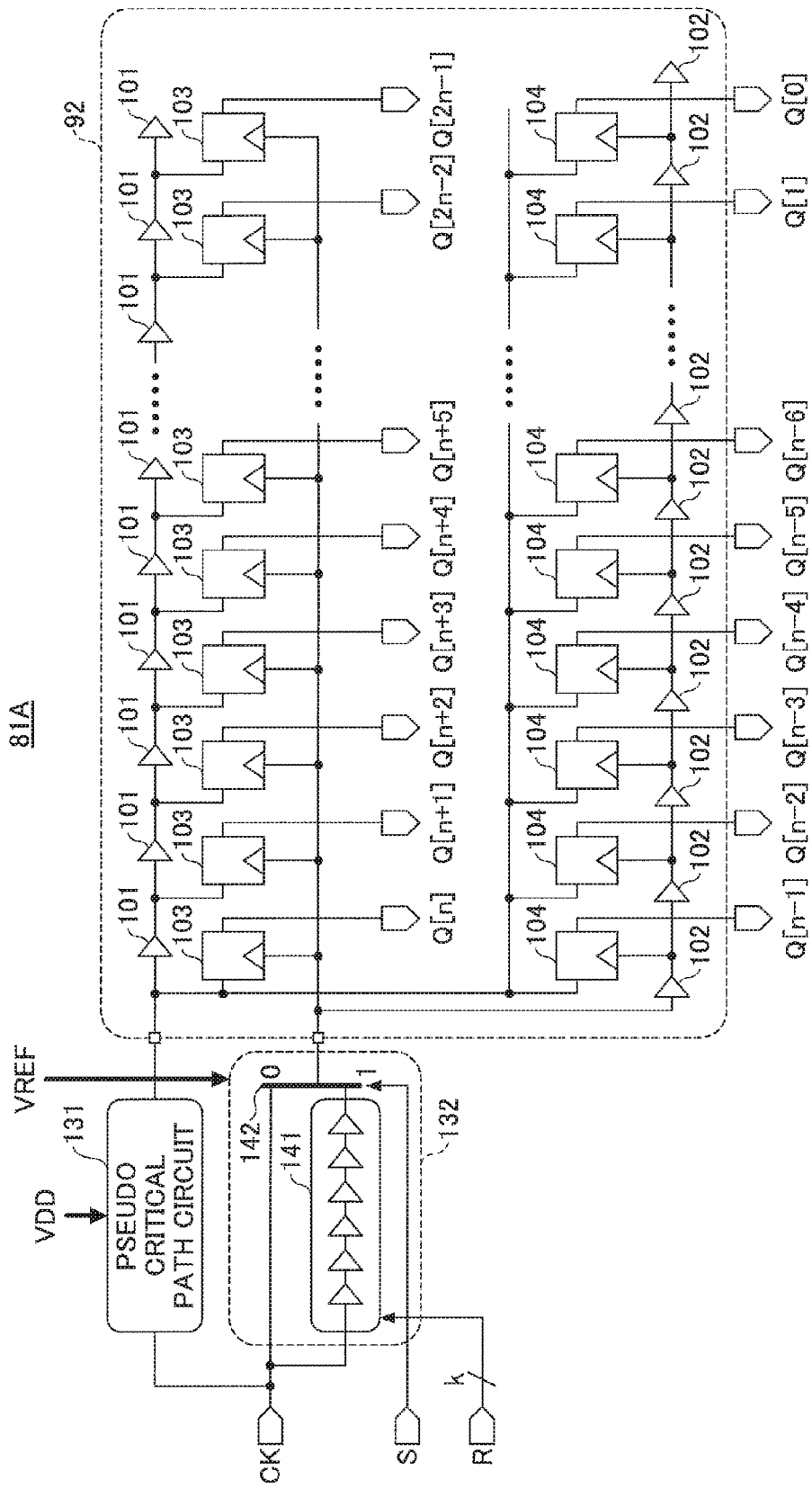
FIG. 15 is a drawing illustrating an example of the configuration of a critical-path-monitor & display-monitor circuit.

FIG. 15 is a drawing illustrating an example of the configuration of the delay monitor circuit 81A. The delay monitor circuit 81A illustrated in FIG. 15 includes a pseudo critical path circuit 131, a delay control circuit 132, and a time-difference measuring circuit 92. The delay control circuit 132 includes a variable delay line 141 and a selection circuit 142.

The pseudo critical path circuit 131 receives the power supply voltage VDD applied thereto, and outputs a first delayed oscillating signal obtained by delaying the clock signal CK. The variable delay line 141 receives the reference voltage VREF applied thereto, and outputs a second delayed oscillating signal obtained by delaying the clock signal CK based on the control signal R. The selection circuit 142 selects, based on a selection signal S applied thereto, a third delayed oscillating signal that is either the clock signal CK or the second delayed oscillating signal.

The first flip-flops 103 included in the time-difference measuring circuit 92 receive at the first input terminals (i.e., clock terminals in this example) thereof the third delayed oscillating signal that is output from the selection circuit 142. The second input terminals (i.e., data input terminals in this example) of the first flip-flops 103 receive the first delayed oscillating signal having respective delays relative to the first delayed oscillating signal at the output of the pseudo critical path circuit 131, such that the respective delays are created by the delay circuits 101 each of which imposes a first predetermined delay length between two adjacent second input terminals of the first flip-flops 103.

The second flip-flops 104 receive at the second input terminals (i.e., data input terminals in this example) thereof the first delayed oscillating signal that is output from the pseudo critical path circuit 131. The first input terminals (i.e., clock input terminals in this example) of the second flip-flops 104 receive the third delayed oscillating signal having respective delays relative to the third delayed oscillating signal at the output of the selection circuit 142, such that the respective delays are created by the delay circuits 102 each of which imposes a second predetermined delay length between two adjacent first input terminals of the second flip-flops 104. The delay time of each of the delay circuits 101 and the delay time of each of the delay circuits 102 may be the same. Namely, the first predetermined delay length and the second predetermined delay length may be equal to each other.

At the time of a routine process during which adaptive frequency control is active, the selection circuit 142 selects and outputs the output of the variable delay line 141. In this state, when the pseudo critical path circuit 131 and the variable delay line 141 have the same delay time, the circuit-delay measurement value Q[2n–1:0] has the n upper-order bits thereof being all zero and the n lower-order bits thereof being all 1. Namely, the circuit-delay measurement value Q[2n–1:0] is equal to {n'b00 . . . 00, n'b11 . . . 11}.

In the case of the circuit delay of the pseudo critical path circuit 131 being longer than the circuit delay of the variable delay line 141, some of the n output data bits of the n second flip-flops 104 are 0, rather than 1. Namely, the circuit-delay measurement value Q[2n–1:0] is smaller than {n'b00 . . . 00, n'b11 . . . 11}.

In the case of the circuit delay of the pseudo critical path circuit 131 being shorter than the circuit delay of the variable delay line 141, some of the n output data bits of the n first flip-flops 103 are 1, rather than 0. Namely, the circuit-delay measurement value Q[2n–1:0] is greater than {n'b00 . . . 00, n'b11 . . . 11}.

In this manner, the delay monitor circuit 81A produces the circuit-delay measurement value Q[2n–1:0] that is a thermometer code indicative of a difference in the circuit delay between the pseudo critical path circuit 131 and the variable delay line 141. The pseudo critical path circuit 131 is driven by the power supply voltage VDD, and the variable delay line 141 is driven by the reference voltage VREF. The reference voltage VREF, which is a power supply voltage supplied from an external source independently of the power supply voltage VDD, is not used by other circuit portions of the electronic circuit illustrated in FIG. 6 or FIG. 7. The reference voltage VREF is free of noise and maintained at a constant voltage level, without fluctuation.

The variable delay line 141 is designed such that the delay time length thereof is equal to one clock cycle of the operating clock cycle used in the routine process of the electronic circuit. The pseudo critical path circuit 131 is designed such that the delay time length thereof is equal to the delay time length of the critical path of the logic circuit 14. With such a design arrangement, the circuit-delay measurement value Q is greater than {n'b00 . . . 00, n'b11 . . . 11} when the circuit delay of the pseudo critical path circuit 131 is shorter than one clock cycle. On the other hand, the circuit-delay measurement value Q is smaller than {n'b00 . . . 00, n'b11 . . . 11} when the circuit delay of the pseudo critical path circuit 131 is longer than one clock cycle. Accordingly, setting the mask signal M to {n'b11 . . . 11, n'b00 . . . 00} allows the detection signal Q output from the mask circuit 82 to start changing (i.e., decreasing) when the circuit delay of the pseudo critical path circuit 131 becomes longer than the one clock cycle. In response to such a change, frequency adjustment is performed with respect to the PLL circuit 10. In reality, however, a time margin may preferably be provided by taking into account the time length required for the control. In consideration of this, the mask signal M is shifted to the left by TH bits, which reduces the number of upper-order bits serving as a mask, thereby allowing the value of the detection signal Q to start changing earlier than otherwise.

Despite the need to manufacture the circuit such that the circuit delay of the variable delay line 141 is equal to one clock cycle, it is difficult to achieve a circuit delay equal to one clock cycle due to process variation and placement variation. It is thus preferable that an initialization process is performed in advance to set the circuit delay of the variable delay line 141 equal to the one clock cycle. This initialization process will be described later.

Figure 16:
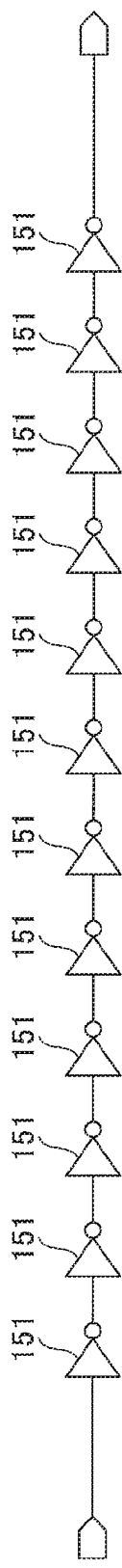
FIG. 16 is a drawing illustrating an example of the configuration of a pseudo critical path circuit.

FIG. 16 is a drawing illustrating an example of the configuration of the pseudo critical path circuit. The pseudo critical path circuit illustrated in FIG. 16 provides a desired delay time length by use of an even number of inverters 151 that are series-connected. This relatively simple circuit configuration enables the realization of a pseudo critical path circuit in which gate delays are predominant.

Figure 17:
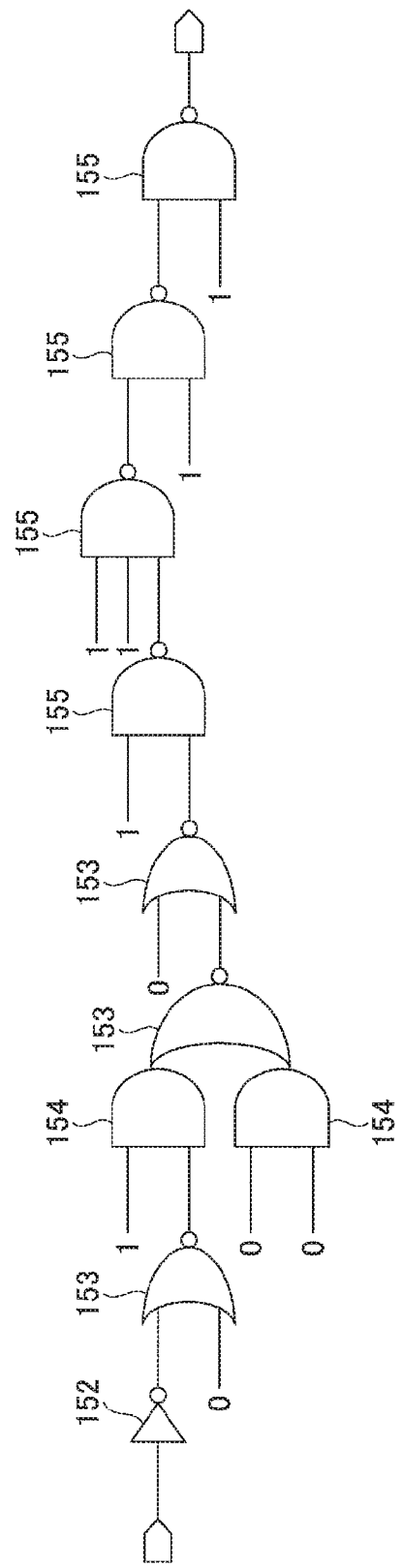
FIG. 17 is a drawing illustrating another example of the configuration of the pseudo critical path circuit.

FIG. 17 is a drawing illustrating another example of the configuration of the pseudo critical path circuit. The pseudo critical path circuit illustrated in FIG. 17 includes an inverter 152, a plurality of NOR gates 153, a plurality of AND gates 154, and a plurality of NAND gates 155. The logic circuit constituted by one NOR gate 153 and two AND gates 154 is a compound logic gate of 2AND-2OR inverter output. Such logic gates are combined and series-connected to provide a desired delay time length. This circuit configuration utilizes a combination of various logic gates as would be present in an actual critical path to achieve a pseudo critical path circuit in which gate delays are predominant, thereby enabling the realization of a circuit delay that behaves more similarly to the circuit delay of an actual critical path.

Figure 18:
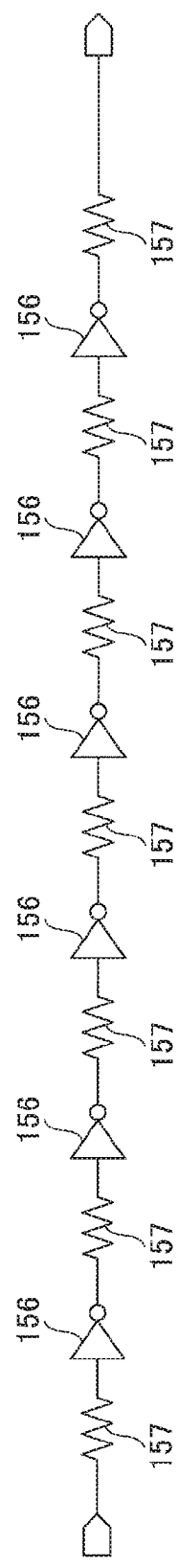
FIG. 18 is a drawing illustrating another example of the configuration of the pseudo critical path circuit.

FIG. 18 is a drawing illustrating another example of the configuration of the pseudo critical path circuit. The pseudo critical path circuit illustrated in FIG. 18 provides a desired delay time length by use of an even number of inverters 156 and a plurality of resistor elements 157 that are alternately placed and series-connected. This relatively simple circuit configuration enables the realization of a pseudo critical path circuit in which wire delays are predominant.

Figure 19:
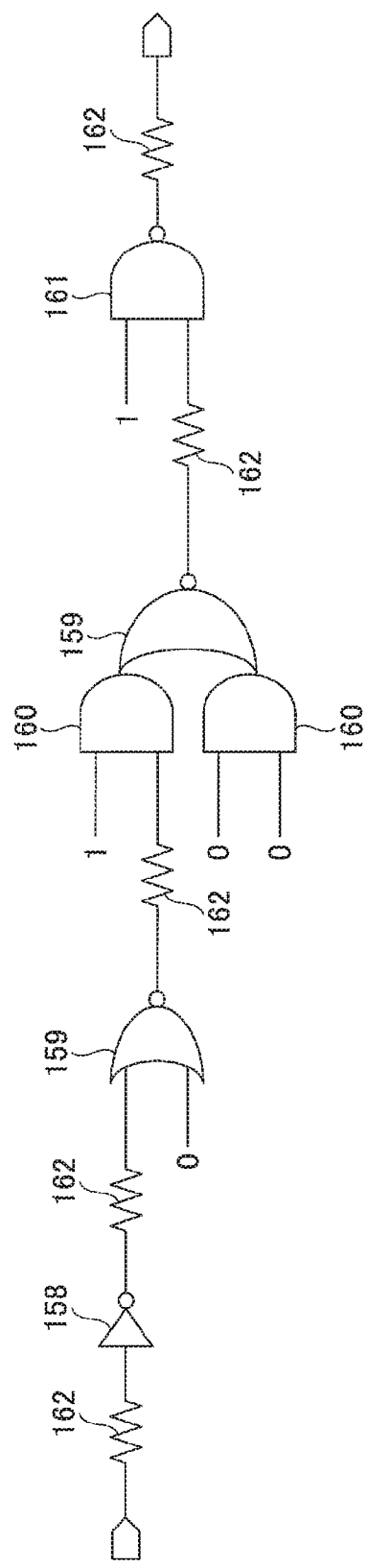
FIG. 19 is a drawing illustrating another example of the configuration of the pseudo critical path circuit.

FIG. 19 is a drawing illustrating another example of the configuration of the pseudo critical path circuit. The pseudo critical path circuit illustrated in FIG. 19 includes an inverter 158, a plurality of NOR gates 159, a plurality of AND gates 160, a NAND gates 161, and a plurality of resistor elements 162. The logic circuit constituted by one NOR gate 159 and two AND gates 160 is a compound logic gate of 2AND-2OR inverter output. Such logic gates and resistor elements are combined and series-connected to provide a desired delay time length. This circuit configuration utilizes a combination of various logic gates as would be present in an actual critical path to achieve a pseudo critical path circuit in which wire delays are predominant, thereby enabling the realization of a circuit delay that behaves more similarly to the circuit delay of an actual critical path.

Figure 20:
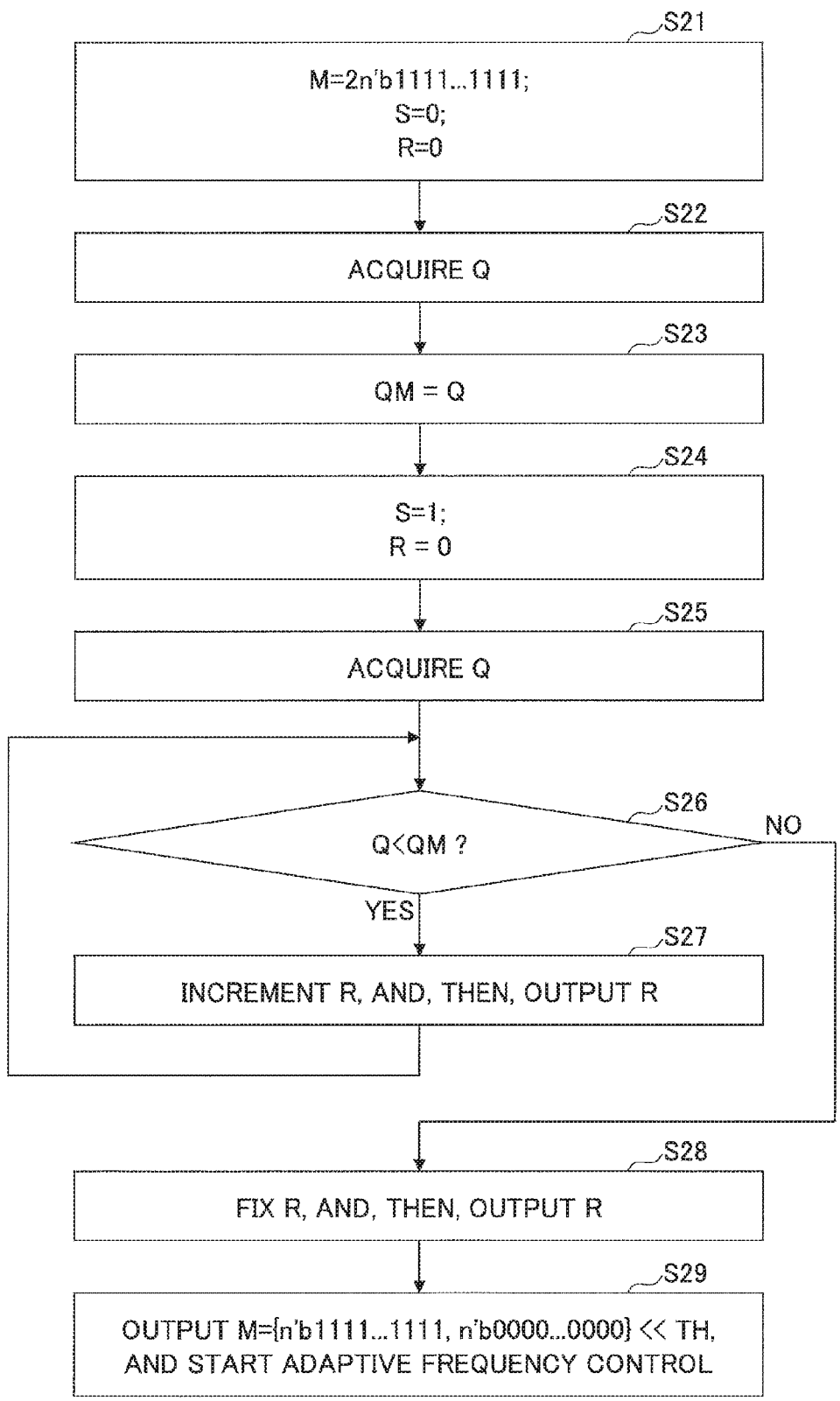
FIG. 20 is a flowchart illustrating an example of a setting operation performed by a control circuit.

FIG. 20 is a flowchart illustrating an example of a setting operation performed by a control circuit. The electronic circuit illustrated in FIG. 13 or FIG. 14 performs an initial setting procedure illustrated in the flowchart of FIG. 20 prior to the commencement of routine processes for its original purposes. In the case of the electronic circuit being a communication circuit, the initial setting procedure illustrated in the flowchart of FIG. 12 is performed prior to the commencement of communication processes by the electronic circuit. After the initial setting, the electronic circuit performs routine processes, and, also, adaptive frequency control is performed to control the oscillating frequency of the PLL circuit 10 in response to a change in the power supply voltage VDD.

In step S21, the control circuit 80A sets all the bits of the mask signal M to 1, and sets the selection signal S and the control signal R to 0. Setting all the bits of the mask signal M to 1 causes all the bits of the output of the mask circuit 82 to be fixed to 1, so that all the bits of the detection signal Q supplied to the PLL circuit 10 and the averaging unit 12 are fixed to 1. This arrangement serves to suspend the adaptive frequency control that controls the oscillating frequency of the PLL circuit 10.

In step S22, the control circuit 80A acquires the circuit-delay measurement value Q output from the display monitor circuit 81A. The selection signal S is 0 in this case, so that the selection circuit 142 illustrated in FIG. 15 selects and outputs the clock signal CK that is directly supplied thereto rather than supplied via the variable delay line 141. As a result, the circuit-delay measurement value Q output from the delay monitor circuit 81A assumes a value indicating a time difference between the clock signal CK having no delay and the clock signal CK having a delay imposed by the pseudo critical path circuit 131, i.e., a value indicating the circuit delay of the pseudo critical path circuit 131. In the case of the delay time length of the pseudo critical path circuit 131 being set substantially equal to the delay time length of the critical path of the logic circuit 14, it is preferable to set the clock signal CK to the same frequency as the operating frequency used by the electronic circuit during its routine operations. The delay time length of the pseudo critical path circuit 131 is generally designed to be equal to a time length that is slightly shorter than one clock cycle of the clock signal. The circuit-delay measurement value Q assumes a value indicative of a time difference measured between a given pulse of the clock signal CK delayed by the pseudo critical path circuit 131 and the next following pulse of the clock signal CK exiting from the selection circuit 142. In the case of the delay time length of the pseudo critical path circuit 131 being set equal to N times the delay time length of the critical path of the logic circuit 14, for example, it is preferable to set the clock signal CK to N times the operating frequency used by the electronic circuit during its routine operations.

In step S23, the control circuit 80A stores the circuit-delay measurement value Q in the register QM. In step S24, the control circuit 80A sets the selection signal S to 1, and sets the control signal R to 0. Because the control signal R is 0, the variable delay line 141 of the delay monitor circuit 81A is placed in such a state as to have the shortest delay time length.

In step S25, the control circuit 80A acquires the circuit-delay measurement value Q output from the display monitor circuit 81A. The selection signal S is 1 in this case, so that the selection circuit 142 illustrated in FIG. 15 selects and outputs the clock signal CK that is delayed by the variable delay line 141. Accordingly, the circuit-delay measurement value Q output from the delay monitor circuit 81A assumes a value indicating a time difference between the clock signal CK delayed by the variable delay line 141 and the clock signal CK delayed by the pseudo critical path circuit 131. Namely, the circuit-delay measurement value Q assumes a value indicative of a time difference measured between a given pulse of the clock signal CK delayed by the pseudo critical path circuit 131 and this given pulse of the clock signal CK delayed by the variable delay line 141.

In step S26, the control circuit 80A checks whether the circuit-delay measurement value Q obtained in step S25 is smaller than the circuit-delay measurement value Q stored in the register QM (i.e., the circuit-delay measurement value obtained in step S22). In the case of the check result being YES, the procedure proceeds to step S27. In the case of the check result being NO, the procedure proceeds to step S28.

In step S27, the control circuit 80A increases the control signal R by 1, and supplies the increased control signal R to the delay monitor circuit 81A. Namely, the control circuit 80A increases the delay time length of the variable delay line 141 of the delay monitor circuit 81A by the minimum increment size Thereafter, the procedure returns to step S25, from which the subsequent steps are repeated.

By the time the procedure reaches step S28, the circuit-delay measurement value Q corresponding to the current control signal R has become equal to the circuit-delay measurement value Q stored in the register QM. Namely, the time difference between a given clock pulse having a delay imposed by the pseudo critical path circuit 131 and the next following clock pulse having no delay is equal to the difference between the delay time length of the pseudo critical path circuit 131 and the delay time length of the variable delay line 141. This means that the delay time length of the variable delay line 141 in this state is equal to one clock cycle of the clock signal CK. In step S28, the control circuit 80A fixes the control signal R in this state, and supplies the fixed control signal R to the delay monitor circuit 81A.

In step S29, the control circuit 80A outputs the mask signal M having one or more bits thereof equal to 0, thereby starting adaptive frequency control. It may be noted that the value of the mask signal M is equal to a value obtained by shifting {n'b00 . . . 00, n'b11 . . . 11} to the left by TH bits.

In the manner described above, the initial setting process illustrated in FIG. 20 serves to set the delay time length of the variable delay line 141 such that the delay time length is equal to one clock cycle of the operating clock signal used by the electronic circuit during it routine operations. With such a setting, the circuit-delay measurement value Q is smaller than {n'b00 . . . 00, n'b11 . . . 11} when the circuit delay of the pseudo critical path circuit 131 is longer than one clock cycle. Accordingly, setting the mask signal M to {n'b11 . . . 11, n'b00 . . . 00} allows the detection signal Q output from the mask circuit 82 to start changing (i.e., decreasing) when the circuit delay of the pseudo critical path circuit 131 becomes longer than the one clock cycle. In consideration of the time needed for control, however, the mask signal M is shifted to the left by TH bits, which reduces the number of upper-order bits serving as a mask, thereby allowing the value of the detection signal Q to start changing earlier than otherwise.

The initialization process illustrated in FIG. 12 performed with respect to the electronic circuit illustrated in FIG. 6 or FIG. 7 involves performing an operation by which the power supply voltage VDD is changed. On the other hand, the initialization process illustrated in FIG. 20 performed with respect to the electronic circuit illustrated in FIG. 13 or FIG. 14 does not involve the operation by which the power supply voltage is changed. These initialization processes are typically performed during a booting operation immediately following the power-on of the electronic circuit. However, it may be often desirable to avoid performing an operation to change the power supply voltage during such a booting operation. The electronic circuit illustrated in FIG. 13 or FIG. 14 does not require the power supply voltage to be changed for the initialization process, and may thus be more preferable.

FIG. 21 is a timing chart illustrating an example of the setting operation performed by the control circuit. FIG. 21 illustrates examples of changes in signal values as observed in the case of n being 4 when the initial setting process illustrated in FIG. 20 is performed. In this example, TH is fixed to 2. In the initial state, the selection signal S is equal to 0, and all the bits of the mask signal M are equal to 1, with the control signal R being equal to 0, due to the execution of the process in step S21 of FIG. 20.

At a time T1 illustrated in FIG. 21, the processes of steps S22 and S23 of FIG. 20 are performed, so that the circuit-delay measurement value Q output from the delay monitor circuit 81A in the case of the selection signal S being 0 is stored in the register QM. In this example, the circuit-delay measurement value Q stored in the register QM is equal to 8b'0111_1111. Namely, the circuit-delay measurement value Q is 8-bit data whose value is "01111111".

At a time T2, the processes of steps S24 and S25 of FIG. 20 are performed. As a result, the circuit-delay measurement value Q is obtained that indicates a time difference between the clock signal CK delayed by the variable delay line 141 and the clock signal CK delayed by the pseudo critical path circuit 131 in the case of the selection signal S being 1. In this example, the circuit-delay measurement value Q that is first obtained is equal to 8b'0000_0111, which is smaller than 8b'0111_1111 stored in the register QM. Accordingly, the process of step S27 of FIG. 20 increases the control signal R. As the control signal R is successively increased, the circuit-delay measurement value Q output from the delay monitor circuit 81A also increases on a step-by-step basis.

Subsequently, in response to the circuit-delay measurement value Q becoming equal to the value stored in the register QM, the process of step S28 of FIG. 20 is performed at a time T3 to fix the value of the control signal R to 15. At a time T4, a value of 8b'1100_0000 obtained by shifting 8b'1111_0000 to the left by TH bits (i.e., 2 bits) is output as the mask signal, and adaptive frequency control is started.

According to at least one embodiment, an electronic circuit can change oscillating frequency at such a high speed as to follow voltage noise.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An electronic circuit, comprising:
   an oscillator configured to generate an oscillating signal having a cycle responsive to an input signal;
   a voltage detector configured to produce a detection signal responsive to a power supply voltage;
   a frequency divider configured to generate a frequency-divided signal obtained by dividing a frequency of the oscillating signal by a frequency-division ratio responsive to the detection signal; and
   an adder configured to obtain a sum of a first signal and a second signal and to supply a signal responsive to the sum to the oscillator as the input signal, the first signal being responsive to a difference in phase between the frequency-divided signal and a reference signal, and the second signal being responsive to the detection signal.

2. The electronic circuit as claimed in claim 1, wherein each of the detection signal and the input signal is a digital code represented in a plurality of bits, and the oscillator is a digitally controlled oscillator.

3. The electronic circuit as claimed in claim 1, wherein the frequency divider is configured to divide the frequency of the oscillating signal by the frequency-division ratio that is responsive to a time average of the detection signal.

4. The electronic circuit as claimed in claim 1, further comprising a logic circuit operating with the power supply voltage, wherein the logic circuit includes a flip-flop whose clock input terminal receives the oscillating signal.

5. The electronic circuit as claimed in claim 1, wherein the voltage detector includes:
   a delay monitor circuit including a first variable delay line, a second variable delay line, n first flip-flops, and n second flip-flops, n being an integer that is two or greater, the first variable delay line configured to be driven by a first voltage and to produce a first delayed oscillating signal obtained by delaying the oscillating signal based on a first control signal, the second variable delay line configured to be driven by a second voltage and to produce a second delayed oscillating signal obtained by delaying the oscillating signal based on a second control signal, the n first flip-flops configured to receive the second delayed oscillating signal at each clock terminal thereof and to receive at data input terminals thereof the first delayed oscillating signal having respective delays, a difference between two of the respective delays at two adjacent corresponding ones of the data input terminals being equal to a first predetermined delay length, and the n second flip-flops configured to receive the first delayed oscillating signal at each data input terminal thereof and to receive at clock terminals thereof the second delayed oscillating signal having respective delays, a difference between two of the respective delays at two adjacent corresponding ones of the clock terminals being equal to a second predetermined delay length;
   a mask circuit configured to produce 2n masked output signals as the detection signal, the 2n masked output signals being obtained by masking 2n output signals of the delay monitor circuit by use of 2n mask signals supplied thereto; and a control circuit configured to produce the first control signal and the second control signal in response to the detection signal, and configured to output the 2n mask signals.

6. The electronic circuit as claimed in claim 1, wherein the voltage detector includes:

a delay monitor circuit including a pseudo critical path circuit, a variable delay line, a selection unit, n first flip-flops, and n second flip-flops, n being an integer that is two or greater, the pseudo critical path circuit configured to be driven by the power supply voltage and to produce a first delayed oscillating signal obtained by delaying the oscillating signal, the variable delay line configured to be driven by a reference voltage and to produce a second delayed oscillating signal obtained by delaying the oscillating signal based on a control signal, the selection unit configured to select and output a third delayed oscillating signal that is either the oscillating signal or the second delayed oscillating signal selected based on a selection signal supplied thereto, the n first flip-flops configured to receive the third delayed oscillating signal at each first input terminal thereof and to receive at second input terminals thereof the first delayed oscillating signal having respective delays, a difference between two of the respective delays at two adjacent corresponding ones of the second input terminals being equal to a first predetermined delay length, and the n second flip-flops configured to receive at first input terminals thereof the third delayed oscillating signal having respective delays, a difference between two of the respective delays at two adjacent corresponding ones of the first input terminals being equal to a second predetermined delay length and to receive the first delayed oscillating signal at each second input terminal thereof;

a mask circuit configured to produce 2n masked output signals as the detection signal, the 2n masked output signals being obtained by masking 2n output signals of the delay monitor circuit by use of 2n mask signals supplied thereto; and a control circuit configured to produce the control signal based on the detection signal and to output the 2n mask signals.

7. The electronic circuit as claimed in claim 6, wherein the pseudo critical path circuit has a delay length responsive to a maximum operating frequency of the electronic circuit.

8. A method of controlling an oscillator, comprising:
causing the oscillator to generate an oscillating signal having a cycle responsive to an input signal applied to the oscillator;
producing a detection signal responsive to a power supply voltage;
performing a frequency-divided-signal generating process to generate a frequency-divided signal obtained by dividing a frequency of the oscillating signal by a frequency-division ratio responsive to the detection signal; and performing an input-signal supplying process to obtain a sum of a first signal and a second signal and to supply a signal responsive to the sum to the oscillator as the input signal, the first signal being responsive to a difference in phase between the frequency-divided signal and a reference signal, and the second signal being responsive to the detection signal.

9. The method as claimed in claim 8, further comprising:
setting a first driving voltage and a second driving voltage to an equal voltage, the first driving voltage being applied to a first variable delay line, and the second driving voltage being applied to a second variable delay line;
performing an adjustment process to reduce to zero a difference in circuit delay between a circuit delay of the first variable delay line and a circuit delay of the second variable delay line under a condition that the first driving voltage and the second driving voltage are equal to each other; and
applying the power supply voltage to the first variable delay line after performing the adjustment process,
wherein the frequency-divided-signal generating process and the input-signal supplying process are performed by generating the detection signal that is a signal responsive to the difference in circuit delay under a condition that the first variable delay line is driven by the power supply voltage and that the second variable delay line is driven by the second driving voltage.

10. The method as claimed in claim 8, further comprising:
applying the power supply voltage and a predetermined driving voltage to a pseudo critical path circuit and a variable delay line, respectively;
performing an adjustment process to adjust a delay time length of the variable delay line equal to one clock cycle of a clock signal; and
measuring a difference in circuit delay between a circuit delay of the pseudo critical path circuit and a circuit delay of the variable delay line after performing the adjustment process,
wherein the frequency-divided-signal generating process and the input-signal supplying process are performed by generating the detection signal that is a signal responsive to the difference in circuit delay.

11. The method as claimed in claim 10, wherein the adjustment process includes:
inputting the clock signal into the pseudo critical path circuit;
measuring a time difference between a first pulse of the clock signal delayed by the pseudo critical path circuit and a second pulse, immediately following the first pulse, of the clock signal; and
adjusting a delay time length of the variable delay line such that a difference between a circuit delay of the pseudo critical path circuit and a circuit delay of the variable delay line is equal to the time difference.

12. The method as claimed in claim 10, wherein the clock signal is the oscillating signal.

* * * * *